(12) United States Patent
Ide et al.

(10) Patent No.: US 6,304,292 B1
(45) Date of Patent: Oct. 16, 2001

(54) DIGITAL VIDEO CAMERA WITH HIGH-SPEED MODE

(75) Inventors: Hirokazu Ide, Osaka; Akio Kobayashi, Hirakata; Hidefumi Okada, Daito; Haruhiko Murata, Takatsuki; Atsushi Kobayashi, Kanagawa; Tomio Ishigamii, Kanagawa; Yasuhiko Naito, Kanagawa, all of (JP)

(73) Assignees: Sanyo Electric Co., Ltd.; Sony Corporation, both of (JP)

( * ) Notice: Subject to any disclaimer, the term of this patent is extended or adjusted under 35 U.S.C. 154(b) by 457 days.

(21) Appl. No.: 08/780,930

(22) Filed: Jan. 9, 1997

(30) Foreign Application Priority Data

Jan. 12, 1996 (JP) .................................................. 8-003647

(51) Int. Cl.[7] .............................. H04N 5/217; H04N 9/64
(52) U.S. Cl. ........................................... 348/243; 348/241
(58) Field of Search .................................. 348/241, 242, 348/243, 299, 314, 367

(56) References Cited

U.S. PATENT DOCUMENTS

| 4,500,915 | * | 2/1985 | Koike et al. | 348/321 |
|---|---|---|---|---|
| 4,740,828 | * | 4/1988 | Kinoshita | 348/333 |
| 4,774,586 | * | 9/1988 | Koike et al. | 348/323 |
| 4,856,033 | * | 8/1989 | Hirota et al. | 348/241 |
| 4,910,599 | * | 3/1990 | Hashimoto | 358/213.26 |
| 5,040,071 | * | 8/1991 | Stevens | 348/321 |
| 5,172,234 | * | 12/1992 | Arita et al. | |
| 5,343,245 | * | 8/1994 | Kim | 348/257 |
| 5,448,306 | * | 9/1995 | Koyama | 348/678 |

FOREIGN PATENT DOCUMENTS

| 0 282 993 | | 9/1988 | (EP) . | |
|---|---|---|---|---|
| 0 391 690 | | 10/1990 | (EP) . | |
| 0 633 691 | | 1/1995 | (EP) . | |
| 5-244490 | | 9/1993 | (JP) . | |
| 5244490 | * | 9/1993 | (JP) | H04N/5/243 |
| 7212657 | * | 1/1994 | (JP) | H04N/5/335 |
| 0633691 | * | 1/1995 | (JP) | H04N/5/217 |
| 7-212657 | | 8/1995 | (JP) . | |

* cited by examiner

*Primary Examiner*—Wendy R. Garber
*Assistant Examiner*—Alicia M Harrington
(74) *Attorney, Agent, or Firm*—Michaelson & Wallace; Peter L. Michaelson

(57) ABSTRACT

A digital video camera includes an addition circuit in which an offset set by a CPU is added to an output from an A/D converter. A clamp level calculation circuit calculates a clamp level on the basis of an average level of eight pixels included in each line within a back end OB (optical black) level detection area in a normal mode, or calculates a clamp level on the basis of an average level of two pixels included in each line within a front end OB level detection area in a quadruplication mode. A first subtraction circuit subtracts the clamp level from an output of the addition circuit so as to clamp the output of the addition circuit. An output of the first subtraction circuit is clipped at a zero-level by a zero-clipping circuit, and an output of the zero-clipping circuit is applied to a second subtraction circuit through a low-pass filter, whereby the same offset can be subtracted from the output of the zero-clipping circuit.

7 Claims, 24 Drawing Sheets

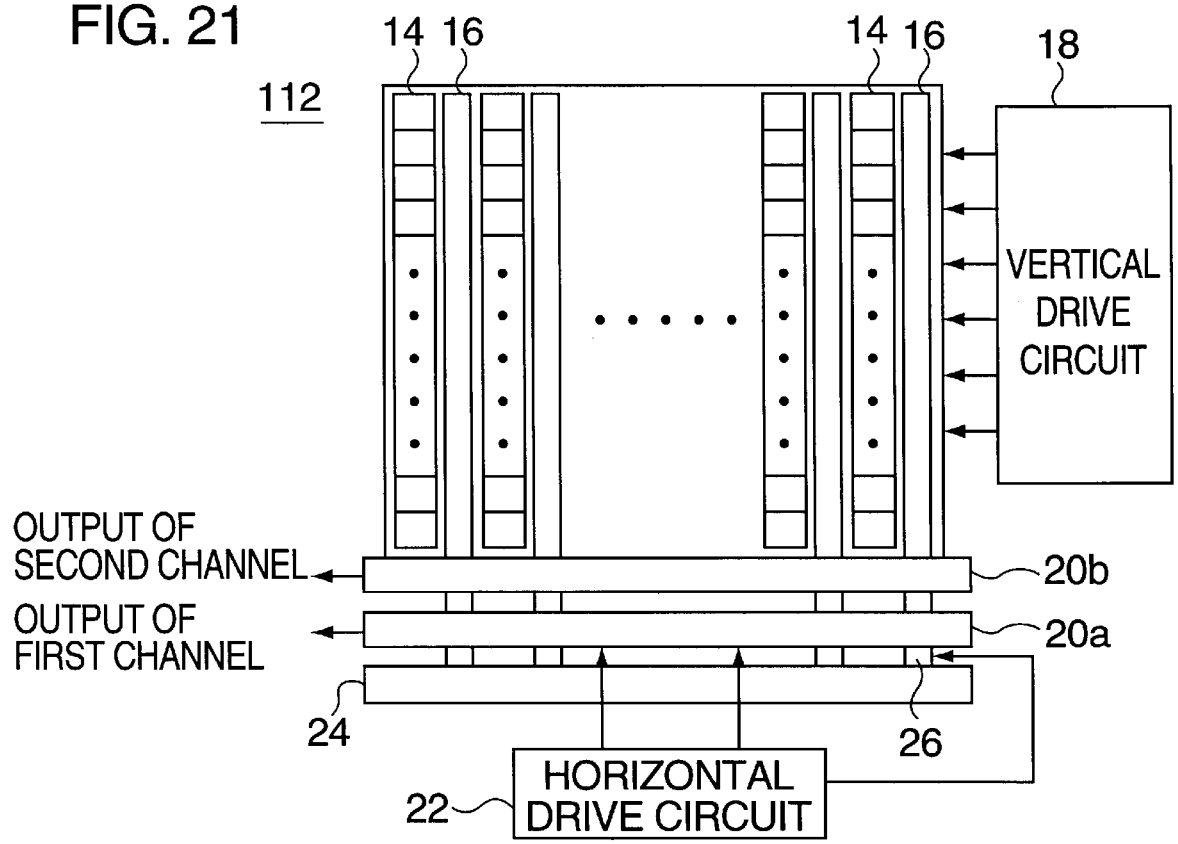

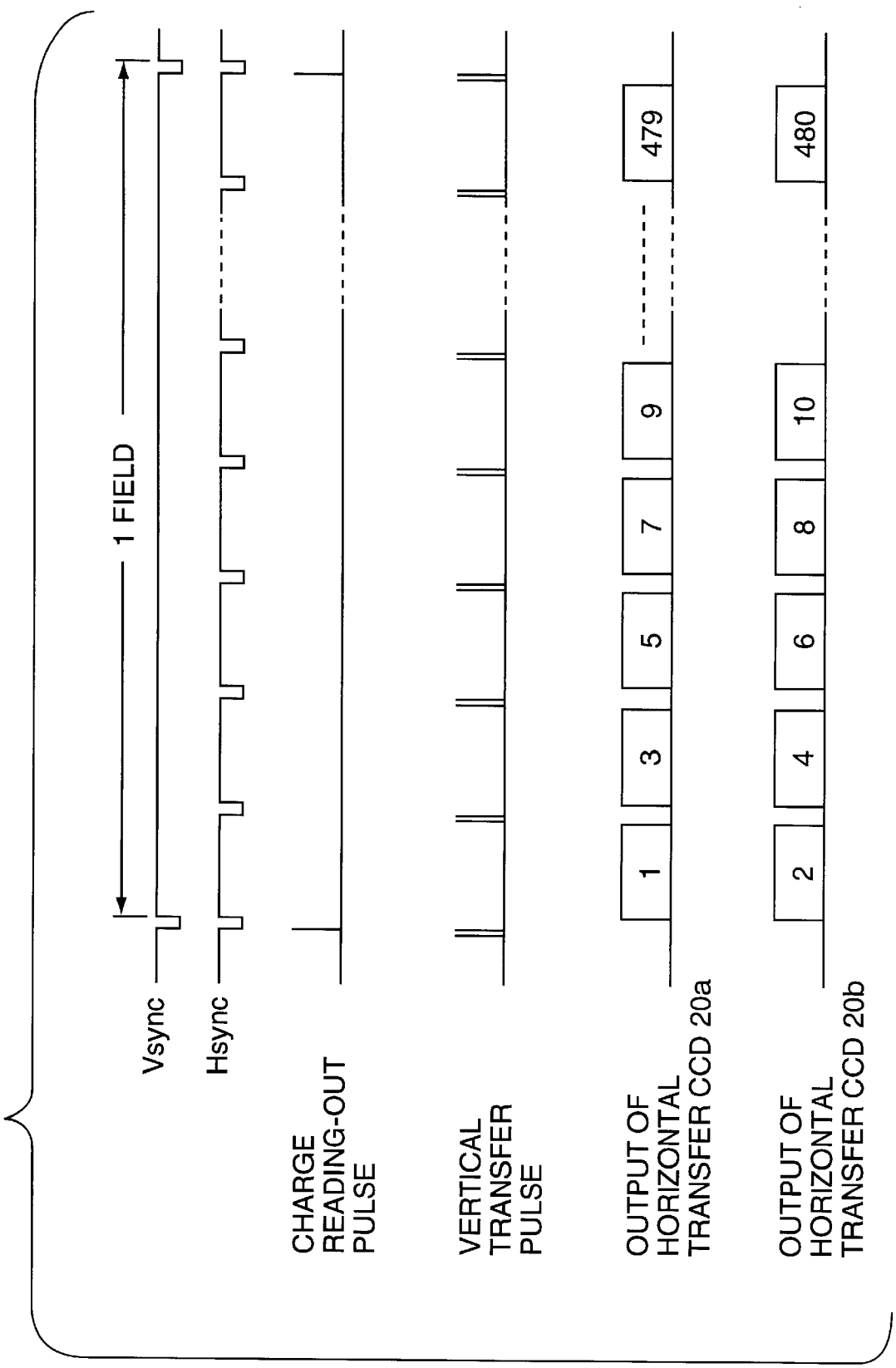

DIGITAL VIDEO CAMERA WITH HIGH-SPEED MODE

BACKGROUND OF THE INVENTION

1. Field of the Invention

The present invention relates to a digital video camera. More specifically, the present invention relates to a digital video camera in which a camera signal obtained from a CCD imager having a mosaic-type color filter or a stripe-type color filter is digitally processed such that an OB (optical black) level is clamped.

2. Description of the Prior Art

One example of a conventional digital video camera in which an OB level can be clamped with using a simple circuit is described in, for example, Japanese Patent Application Laying-open No. 5-244490 [H04N 5/243, 5/16, 5/335, 9/04, 9/72] laid-open on Sep. 21, 1993.

In the prior art, an offset is added to an output of a CCD imager, and a clamp level, which is calculated on the basis of an OB level at a back end of the output of the CCD imager, is subtracted from an addition result, and the offset is subtracted again from a subtraction result. Therefore, a video signal having no black level deviation can be obtained. In addition, "the black level deviation" means an phenomenon that a black level raised above a reference black level and thus a black imge is displayed as a grayish black image.

On the other hand, other examples of a digital video camera having a quadruplication mode are described in, for example, Japanese Patent Application Laying-open No. 63-250287 [H04N 5/225, 5/335, 3/00] laid-open on Oct. 18, 1988, Japanese Patent Application Laying-open No. 7-212657 [H04N 5/335, H01L 27/12] laid-open on Aug. 11, 1996, and a U.S. patent application Ser. No. 08/188,543 [H04N 5/335, H01L 27/12] filed on Jan. 28, 1994. In each of the prior art references only a portion of an output of a CCD imager is used as a camera signal, and the remainder is swept-out to a drain.

Accordingly, it is impossible to apply the former prior art to the latter prior art references because the output of the CCD imager having the OB level at the back end, the OB level being utilized in the former prior art, is swept-out in the latter prior art references.

SUMMARY OF THE INVENTION

Therefore, a principal object of the present invention is to provide a digital video camera capable of surely clamping an OB level in a quadruplication mode.

According to the present invention, a digital video camera comprises: a switching means for switching between a first mode in which a whole of each line signal outputted from a CCD imager is utilized for displaying an image and a second mode in which only a portion of each line signal, including a front end, is utilized for displaying an image; a first period defining means for defining a first predetermined period at a back end of the line signal in the first mode; a second period defining means for defining a second predetermined period at the front end of the line signal in the second mode; an A/D conversion means for converting the line signal obtained from the CCD imager into a digital signal; a clamp level calculation means for calculating a clamp level on the basis of the digital signal outputted from the A/D conversion means in one of the first predetermined period and the second predetermined period; and a clamping means for clamping the line signal at the clamp level.

A digital video camera further comprises: a first subtraction means for subtracting a clamp level from a digital signal from the A/D conversion means; an addition means for adding a predetermined offset to one of the digital signal from the A/D conversion means and a clamped digital signal from the first subtraction means; a clipping means for zero-clipping a digital signal that the predetermined offset has been added by the addition means; a low-pass filter means for processing a digital signal outputted from the clipping means; and a second subtraction means for subtracting the predetermined offset from a digital signal from the low-pass filter means.

A line signal, which is outputted from the CCD imager and in which reset noise is reduced by a correlative double sampling circuit, is applied to an automatic gain control (AGC) circuit, for example, whereby an amplitude of the line signal is properly adjusted. Then, an output of the AGC circuit is converted into the digital signal by the A/D conversion means.

The switching means switches the first mode, or the second mode such as a quadruplication mode. The first period defining means, such as a back end clamp timing circuit, for example, defines the first predetermined period including a portion having an OB level at the back end of each line. The second period defining means, such as a front end clamp timing circuit, for example, defines the second predetermined period including a portion having an OB level at the front end of each line.

The clamp level calculation means calculates an average of the OB level (reference level) in the first predetermined period or the second predetermined period for each line on the basis of the digital signal from the A/D conversion means, and calculates the clamp level based on the average level by a recursive digital filter.

The clamp level is subtracted from the digital signal outputted from the A/D conversion means by the subtraction means, whereby the digital signal is clamped. On the other hand, the addition means are provided between the A/D conversion means and the first subtraction means or at a succeeding stage of the first subtraction means, and the addition means add the predetermined offset to the digital signal from the A/D conversion means or the clamped digital signal from the first subtraction means. If a digital signal from the addition means is zero-clipped by the clipping means, a negative component of a random noise remains in the digital signal due to the addition of the offset. Accordingly, if a digital signal from the clipping means is applied to the low-pass filter means, and thereafter, the offset having the same level as the offset added by the addition means is subtracted from a digital signal from the low-pass filter, the OB level becomes substantially zero. Therefore, no black level deviation occurs.

According to the present invention, since the clamp level can be calculated even if any of the first mode and the second mode is selected by the switching means, the OB level can be surely clamped only by providing the clamping means at a succeeding stage of the A/D conversion means for each channel. Furthermore, since the same offset is first added by the addition means, and then, subtracted from the digital signal by the offset by the second subtraction means after the clipping circuit and the low-pass filter means, the OB level substantially becomes the zero level. Accordingly, it is possible to prevent the black level deviation from occurring.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 20 is an illustrative view showing an arrangement of a mosaic-type color filter used in a second embodiment according to the present invention;

FIG. 21 is an illustrative view showing a CCD imager of the second embodiment;

FIG. 22 is a timing chart showing an operation of the second embodiment in a normal mode (first mode);

DETAILED DESCRIPTION OF THE PREFERRED EMBODIMENTS

Figure 1:
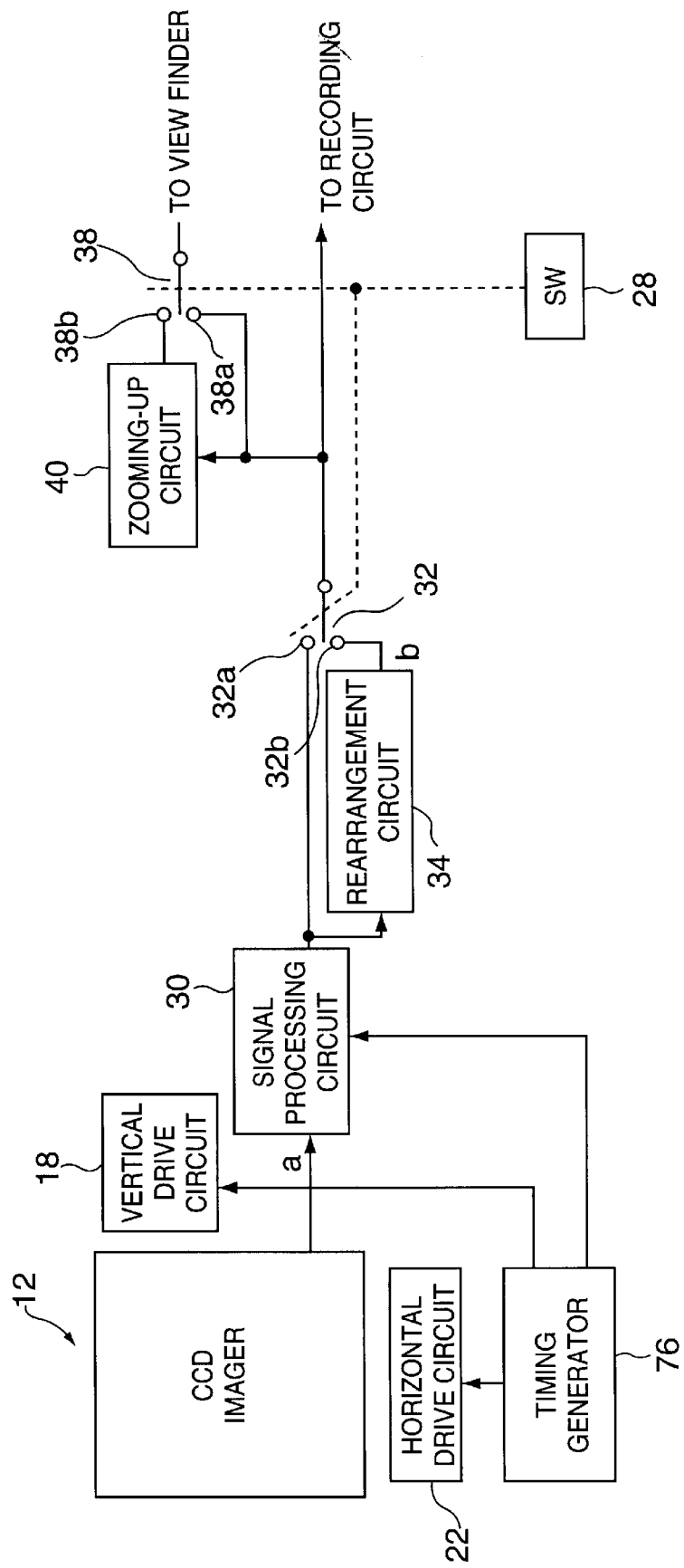
FIG. 1 is a block diagram showing a first embodiment according to the present invention.
Figure 2:
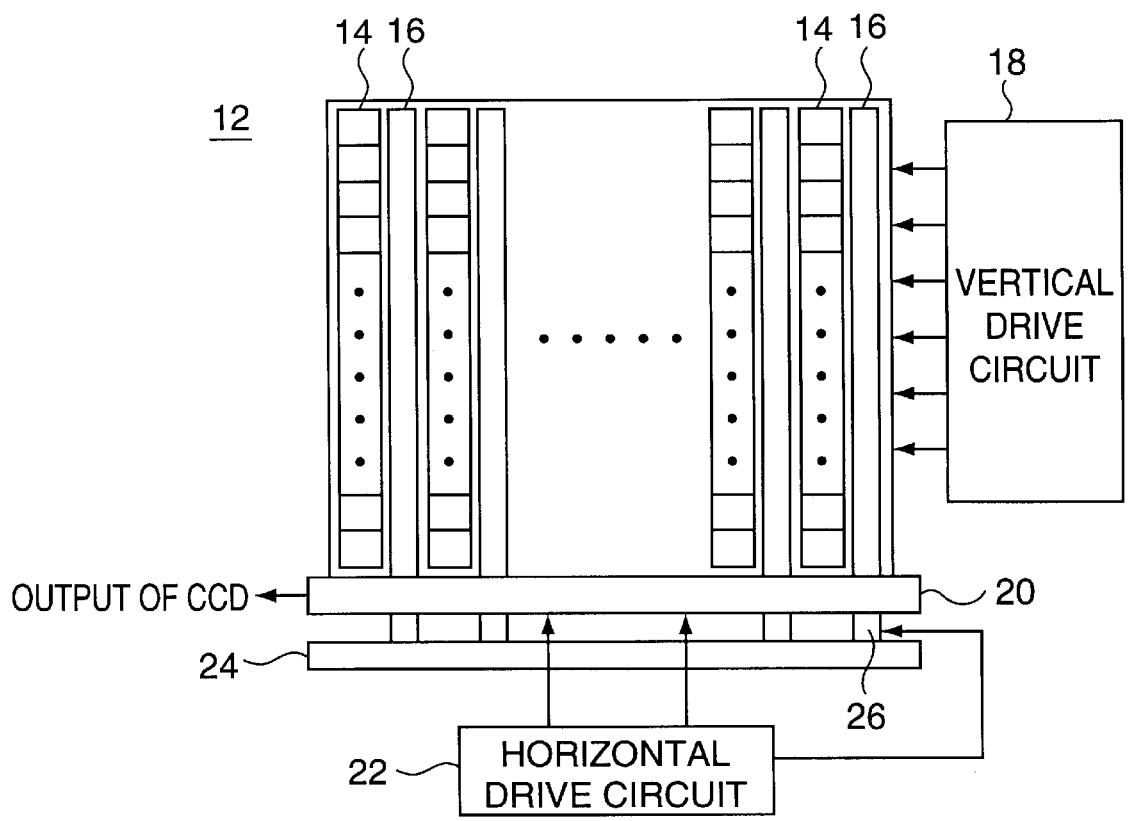
FIG. 2 is an illustrative view showing a CCD imager of FIG. 1 embodiment.

A digital video camera 10 according to a first embodiment shown in FIG. 1 includes a CCD imager 12. As shown in FIG. 2, the CCD imager 12 includes the number M of photo-diodes 14 for photo-electric conversion, and a plurality of vertical transfer CCDs 16, and a horizontal transfer CCD 20 as shown in FIG. 2. Each of the vertical transfer CCDs 16 is driven by a vertical drive circuit 18, and the horizontal transfer CCD 20 is driven by a horizontal drive circuit 22. A drain 24 is provided in parallel to the horizontal transfer CCD 20, The drain 24 is utilized for sweeping-out unnecessary charges in a high-speed mode, e.g. quadruplication mode. That is, the unnecessary charges applied from the vertical transfer CCDs 16 through sweeping-out control gates 26 are swept-out from the drain 24.

Figure 18:
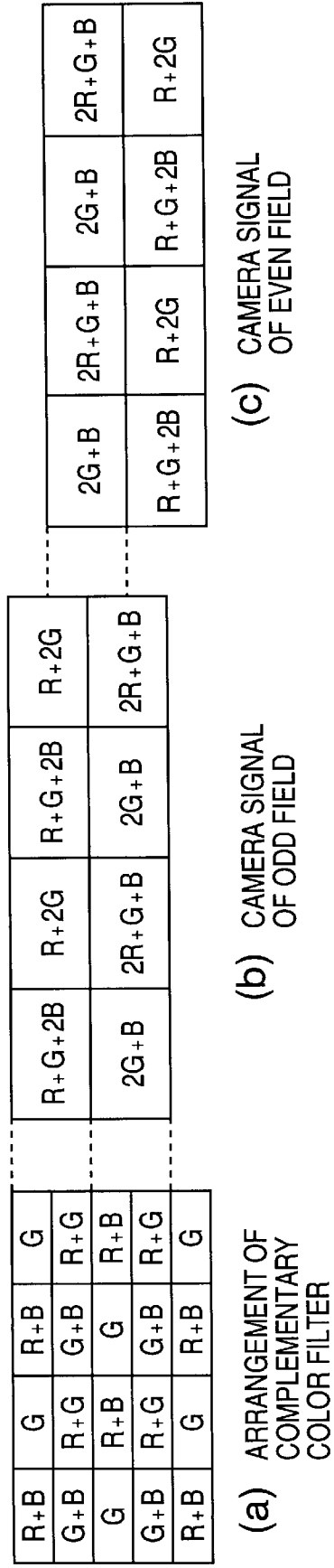
FIG. 18 is an illustrative view showing an arrangement of a mosaic-type color filter used in FIG. 1 embodiment.

In addition, the CCD imager 12 is provided with a mosaic-type color filter of complementary colors as shown in FIG. 18(a). The charges of two pixels adjacent to each other in a vertical direction are mixed as shown in FIG. 18(b) at an odd filed or as shown in FIG. 18(c) at an even field when the charges are outputted from the photo-diodes 14 to the vertical transfer CCDs 16. Accordingly, though the number of pixels of the CCD imager 12 in the vertical direction is "480", the number of lines included in a camera signal actually outputted from the CCD imager 12 with each field becomes "240". In addition, since a method for generating a video signal from the camera signal shown in FIG. 18(b) and FIG. 18(c) is described in Japanese Patent Application Laying-open No. 6-46431, for example, a duplicate description will be omitted here.

Figure 3:
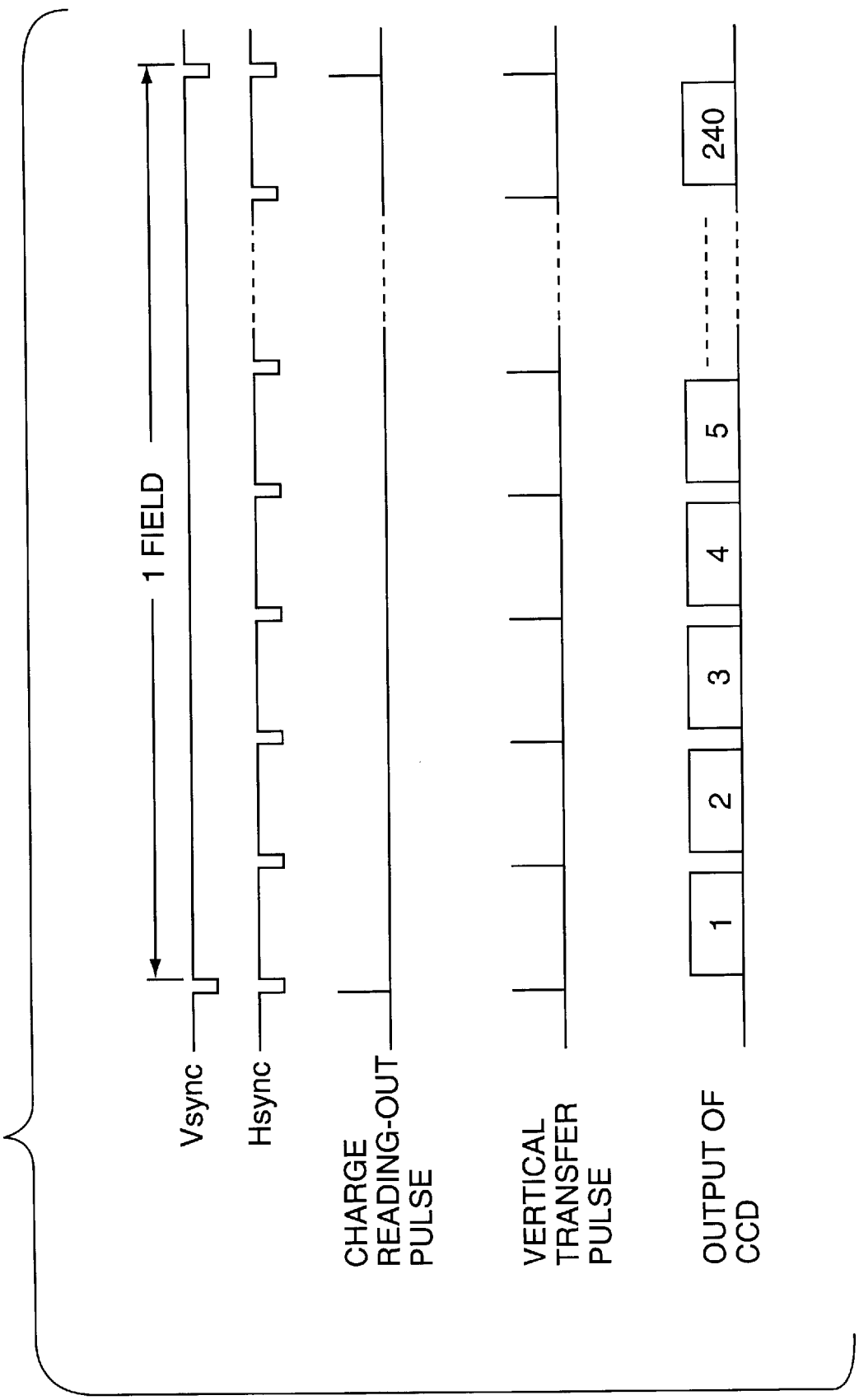
FIG. 3 is a timing chart showing an operation of FIG. 2 embodiment in a normal mode (a first mode)

In a normal mode, i.e. a first mode, the CCD imager 12 is operated in accordance with a field-by-field storage mode as shown in FIG. 3. More specifically, a charge reading-out pulse is supplied from the vertical drive circuit 18 to the vertical transfer CCDs 16 at every one (1) field, and the charges stored in the photo-diodes 14 are read-out to the vertical transfer CCDs 16 at every one field. Thereafter, a vertical transfer pulse is supplied to the vertical transfer CCDs 16, and the charges of one line are transferred to the horizontal transfer CCD 20 at every one line, respectively in response to the vertical transfer pulse. The horizontal transfer CCD 20 outputs the charges of the one line for one horizontal period (one line period) in response to a horizontal transfer clock having a predetermined frequency.

Figure 4:
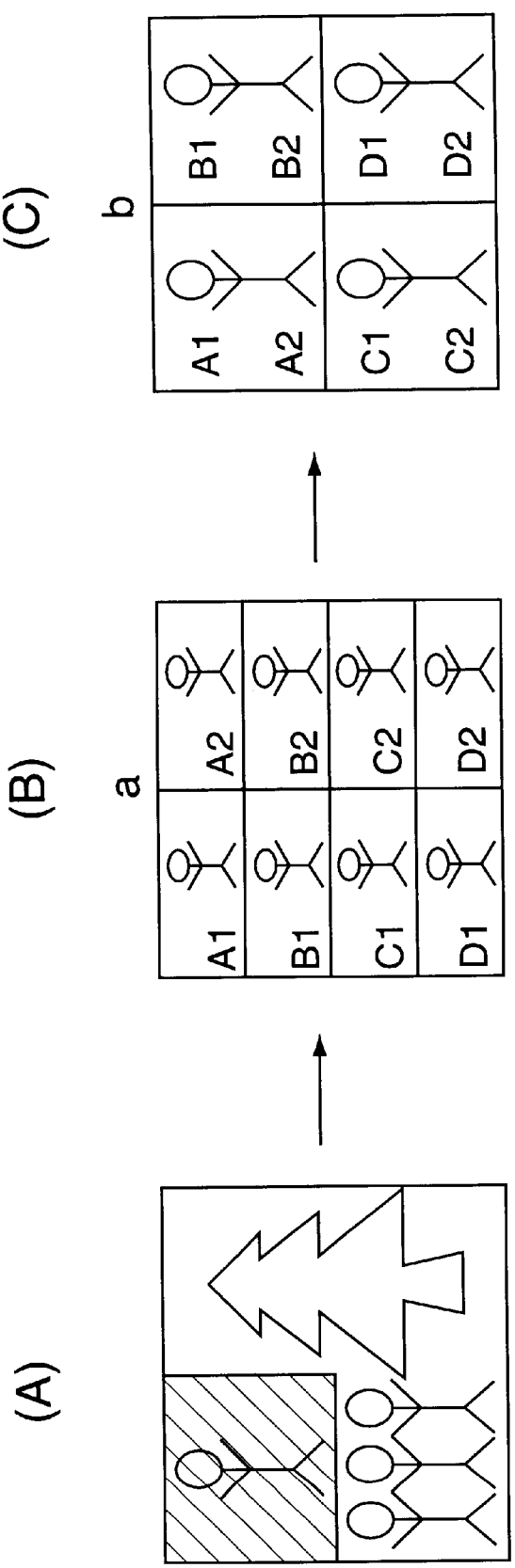
FIG. 4 is an illustrative view showing constitution of images in a quadruplication mode (a second mode)

In contrast, in a case where a quadruplication mode, i.e. a second mode is selected by a quadruplication switch 28 as switching means shown in FIG. 1, the charges of an upper-left quarter are indicated by diagonal lines in FIG. 4(A) which shows an image displayed on a monitor in the normal mode are taken-out and utilized.

In addition, as understood from FIG. 2, since the horizontal transfer CCD 20 is provided at a lower side of the CCD imager 12, an optical image upside down is irradiated onto a charge area of the CCD imager 12. Accordingly, a charge area for an image indicated by the diagonal lines in FIG. 4(A) is actually formed on a lower left quarter area of the charge area; however, this embodiment is, for convenience, described as the charge area for the image utilized in the quadruplication mode is formed on the upper left quarter area as shown in FIG. 4(A).

Figure 5:
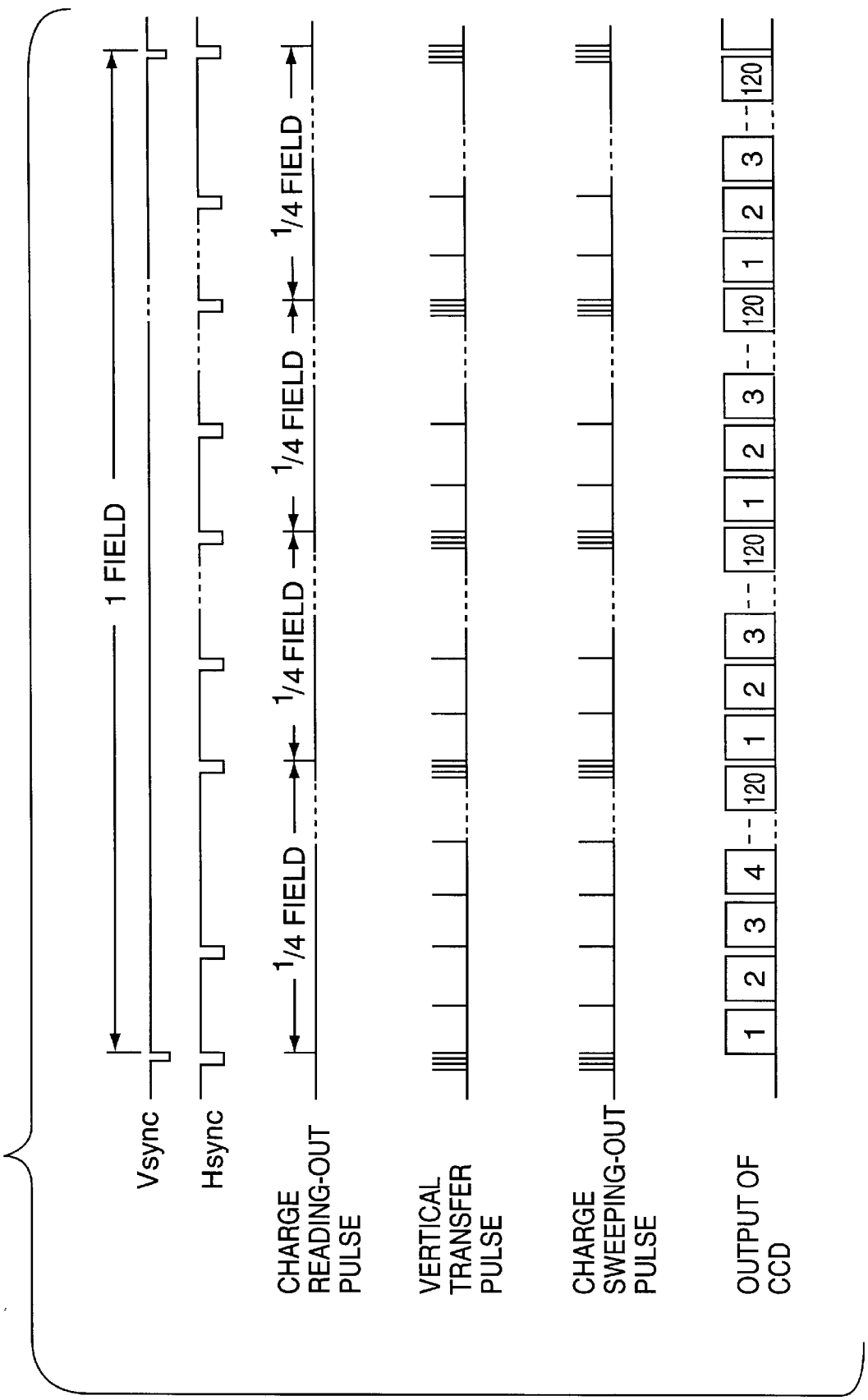
FIG. 5 is a timing chart showing an operation of FIG. 2 embodiment in a quadruplication mode.

In describing the quadruplication mode in detail, the charge reading-out pulse is supplied to the vertical transfer CCDs 16 at every quarter field as shown in FIG. 5. Furthermore, each of the vertical transfer CCDs 16 is driven by the vertical transfer pulse which has one rising edge at a half line and is generated 120 times during a sweeping-out period at every quarter field. Accordingly, the charges equal to one line are transferred to the horizontal transfer CCD 20 at every half line. That is, since the horizontal transfer CCD 20 is driven by the horizontal transfer clock which is the same as the horizontal transfer clock used in the normal mode, the charges of a succeeding line are started to be transferred from the vertical transfer CCDs 16 at a timing that the horizontal transfer CCD 20 has finished the transfer of first half charges but the second half charges are still remaining. On the other hand, a sweeping-out pulse is provided at that timing, and the sweeping-out control gates 26 are opened by the sweeping-out pulse. Accordingly, the second half charges are swept-out from the drain 24 through the sweeping-out control gates 26.

That is, in the quadruplication mode, only the first half charges of each line are outputted from the horizontal transfer CCD 20, and the second half charges of each line are swept-out from the drain 24. Accordingly, one screen is constituted by eight (8) images in each of which the upper-left image indicated by the diagonal lines in FIG. 4(A) is compressed into ½ in a horizontal direction. In addition, images at a left side and a right side are respectively constituted by odd lines and even lines of the camera signal on the same time axis.

Thus, the CCD imager 12 is operated in the normal mode when the quadruplication switch 28 is not operated (open) and is operated in the quadruplication mode when the quadruplication switch 28 is operated (closed). In both cases, the charges, i.e. the camera signal outputted from the CCD imager 12, are applied to a signal processing circuit 30 shown in FIG. 1 and is subjected to processing such as automatic gain control (AGC), analog clamping, A/D conversion, digital clamping and etc. Therefore, a color camera signal is outputted from the signal processing circuit 30.

The color camera signal from the signal processing circuit 30 is applied to a contact point 32*a* of a switch 32 as it is, and applied to a contact point 32*b* of the switch 32 through a rearrangement circuit 34. The switch 32 is interlocked with the quadruplication switch 28. That is, the switch 32 is connected to the contact point 32*a* when the quadruplication switch 28 is turned-off, and the switches 32 is connected to the contact point 32*b* when the quadruplication switch 28 is turned-on. Accordingly, the color camera signal from the signal processing circuit 30 is outputted from the switch 32 when the quadruplication switch 28 is turned-off, and the color camera signal from the rearrangement circuit 34 is outputted from the switch 32 when the quadruplication switch 28 is turned-on.

Figure 6:
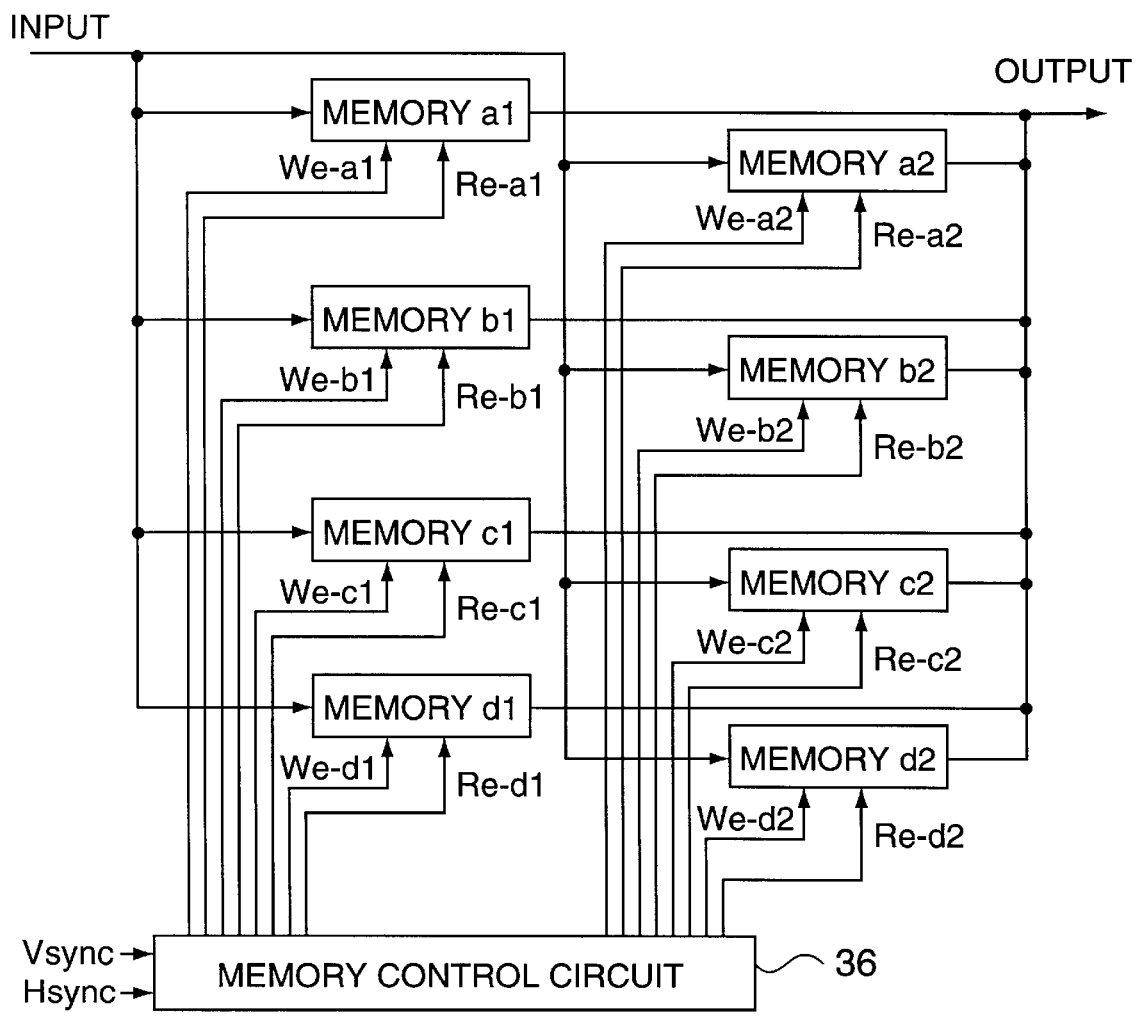
FIG. 6 is a block diagram showing a rearrangement circuit of FIG. 1 embodiment.
Figure 7:
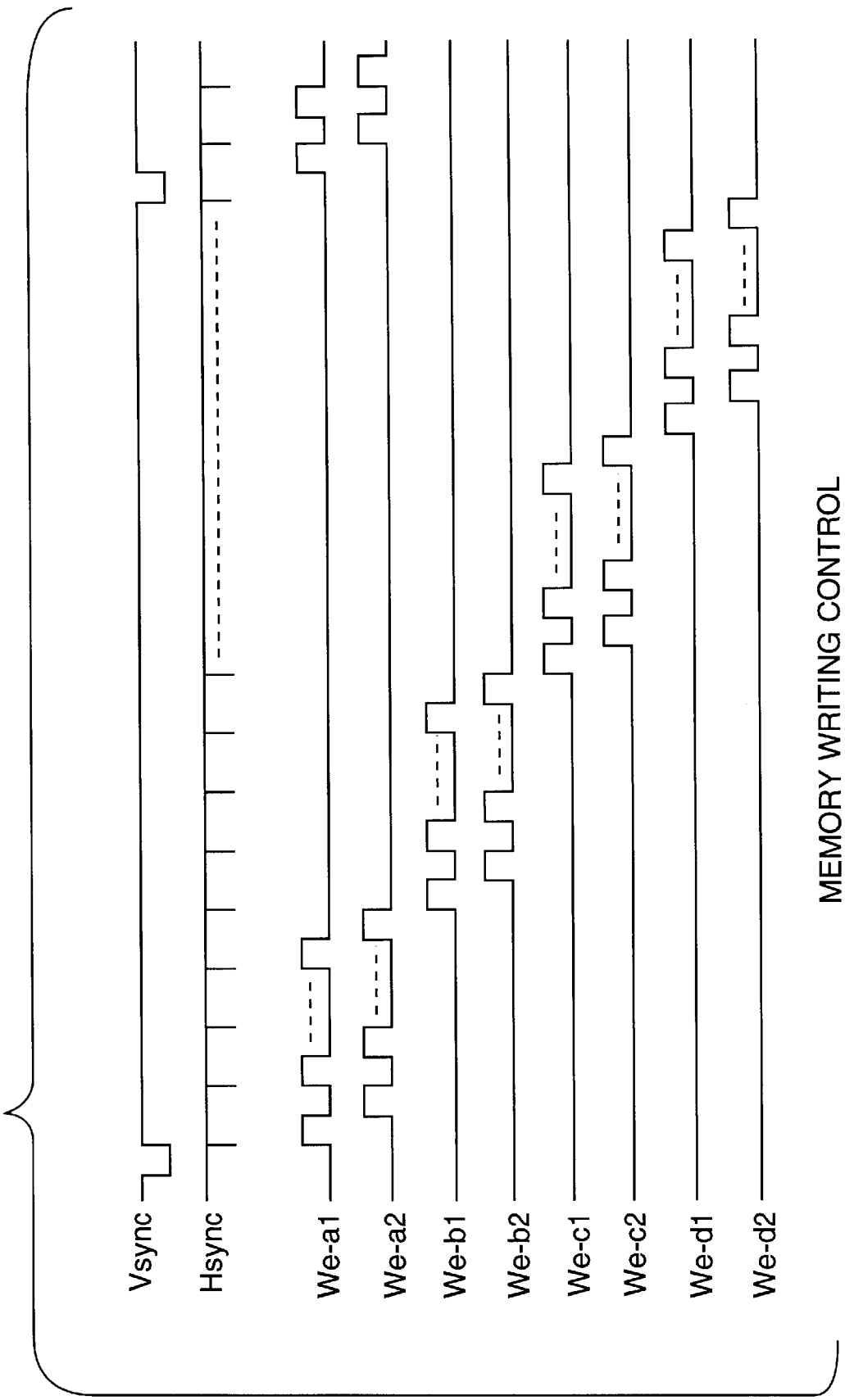
FIG. 7 is a timing chart showing a writing operation to memories in FIG. 6 embodiment.

The rearrangement circuit 34 includes eight (8) memories a1, a2, b1, b2, c1, c2, d1 and d2, and a memory control circuit 36 as shown in FIG. 6. Each of the memories a1, a2, b1, b2, c1, c2, d1 and d2 has a memory capacity equal to one-eight (⅛) the screen, and stores a color camera signal each corresponding to each of eight areas A1, A2, B1, B2, C1, C2, D1 and D2 shown in FIG. 4(B). More specifically, the color camera signals corresponding to the areas A1 and A2 are alternately written into the memories a1 and a2 at every half line in a first quarter field in response to write enable signals We-a1 and We-a2 as shown in FIG. 7. The color camera signals corresponding to the areas B1 and B2 are alternately written into the memories b1 and b2 at every half line in the second quarter field in response to write enable signals We-b1 and We-b2. The color camera signals corresponding to the areas C1, C2, D1 and D2 are succeedingly written into the memories c1, c2, d1 and d2 in response to write enable signals We-c1, We-c2, We-d1 and We-d2 in the same manner.

Figure 8:
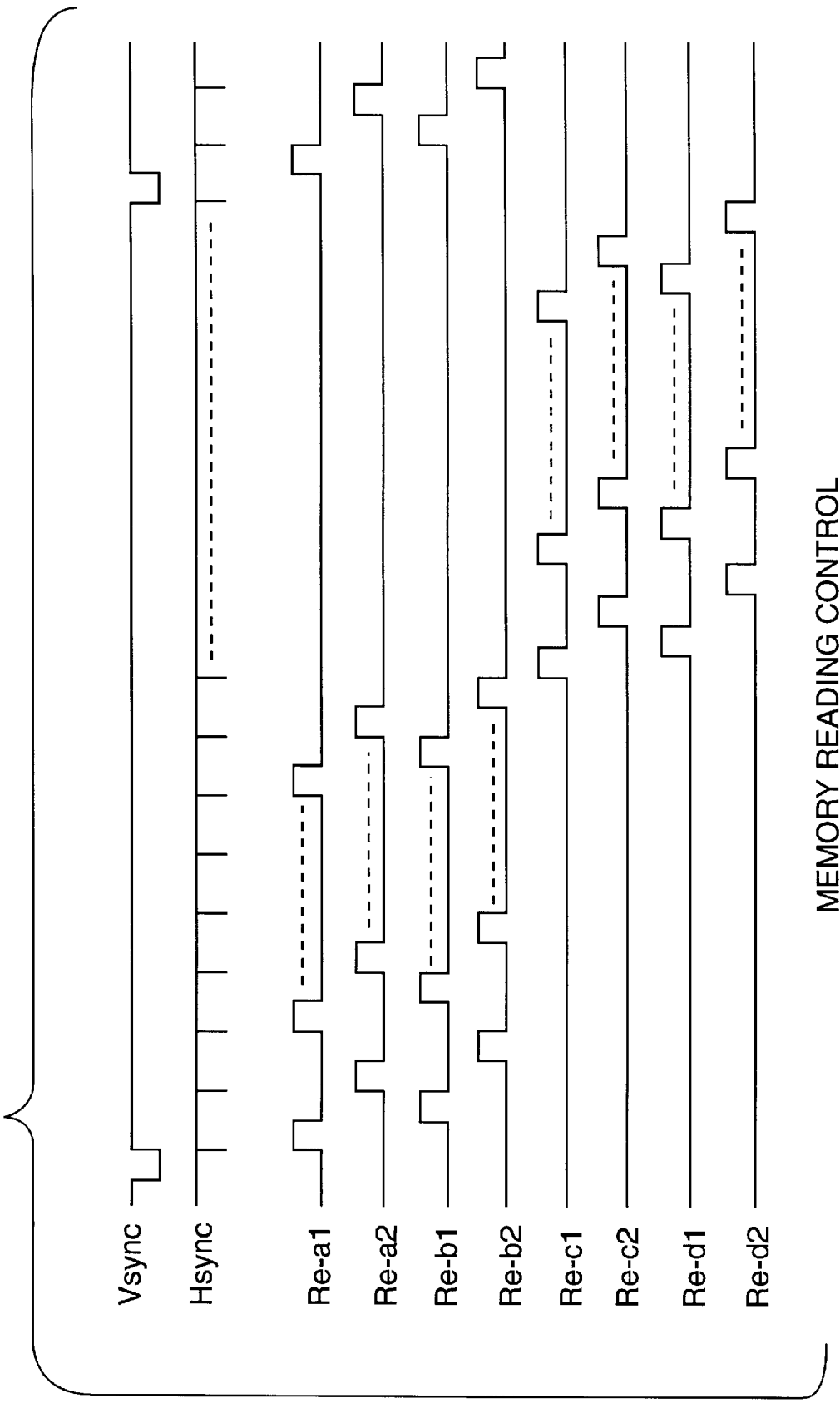
FIG. 8 is a timing chart showing a reading operation from the memories in FIG. 6 embodiment.

Then, read enable signals Re-a1, Re-a2, Re-b1 and Re-b2 are repeatedly applied to the memories a1, b1, a2 and b2 in this order at the first half field as shown in FIG. 8. Therefore, the color camera signals are read-out from the memories a1, b1, a2 and b2. Read enable signals Re-c1, Re-c2, Re-d1 and Re-d2 are repeatedly applied to the memories c1, d1, c2 and d2 in this order in the second half field, and therefore, the color camera signals are read-out from the memories c1, d1, c2 and d2. Thus, the color camera signals corresponding to the images shown in FIG. 4(C) are outputted from the rearrangement circuit 34.

The color camera signal outputted from the switch 32 shown in FIG. 1 is outputted to a recording circuit (not shown), and directly applied to a contact point 38*a* of a switch 38 and applied to a contact point 38*b* of the switch 38 through a zooming-up circuit 40. The zooming-up circuit 40 zooms-up the color camera signal from the switch 32 into two times in each of the horizontal direction and the vertical direction in the quadruplication mode. The switch 38 interlocks with the quadruplication switch 28 similar to the switch 32. Accordingly, the color camera signal from the switch 32 is applied to a view finder (not shown) as it is at a time that the quadruplication switch 28 is turned-off, and a color camera signal zoomed-up by the zooming-up circuit 40 is applied to the view finder at a time that the quadruplication switch 28 is turned-on.

Operations of the digital video camera 10 in the normal mode or first mode and in the quadruplication mode or second mode has been briefly described in the above. A clamping operation in the signal processing circuit 30 will be described in the below.

Figure 9:
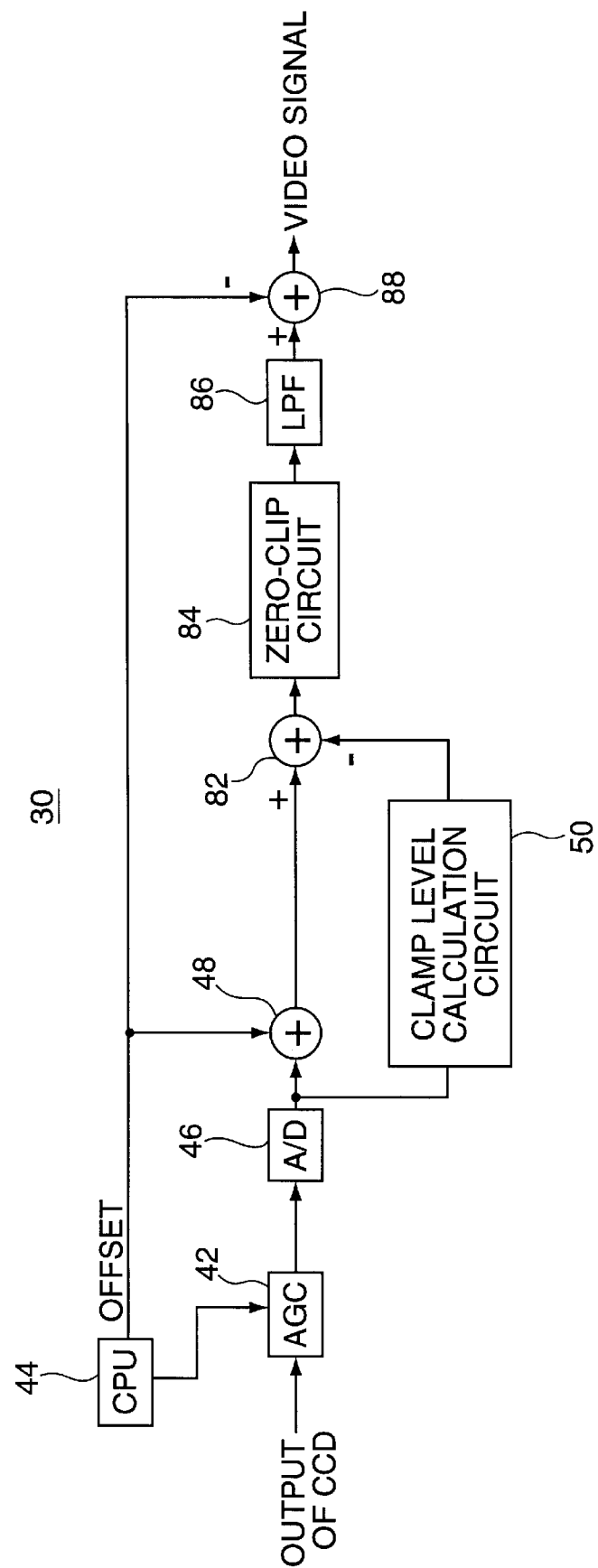
FIG. 9 is a block diagram showing a signal processing circuit of FIG. 1 embodiment.

The signal processing circuit 30 of this embodiment shown in FIG. 9 includes an AGC circuit 42 which receives a camera signal in which reset noise is reduced by a correlative double sampling circuit (not shown). The AGC circuit 42 suitably adjusts an amplitude of the camera signal from the CCD imager 12 in accordance with an AGC voltage from an AGC voltage generation circuit (not shown). In addition, the AGC voltage is generated on the basis of a gain control signal applied from a CPU 44 as a PWM signal. A camera signal having an adjusted amplitude is applied to an A/D converter 46. The A/D converter 46 converts the camera signal into a digital signal to apply to an addition circuit 48 and clamp level calculation circuit 50.

The addition circuit 48 adds an offset applied from the CPU 44 to the digital signal. The offset is preferably set in accordance with a gain set into the AGC circuit 42. Accordingly, the offset becomes large in a case where the gain is large, and the offset becomes small in a case where the gain is small.

Figure 10:
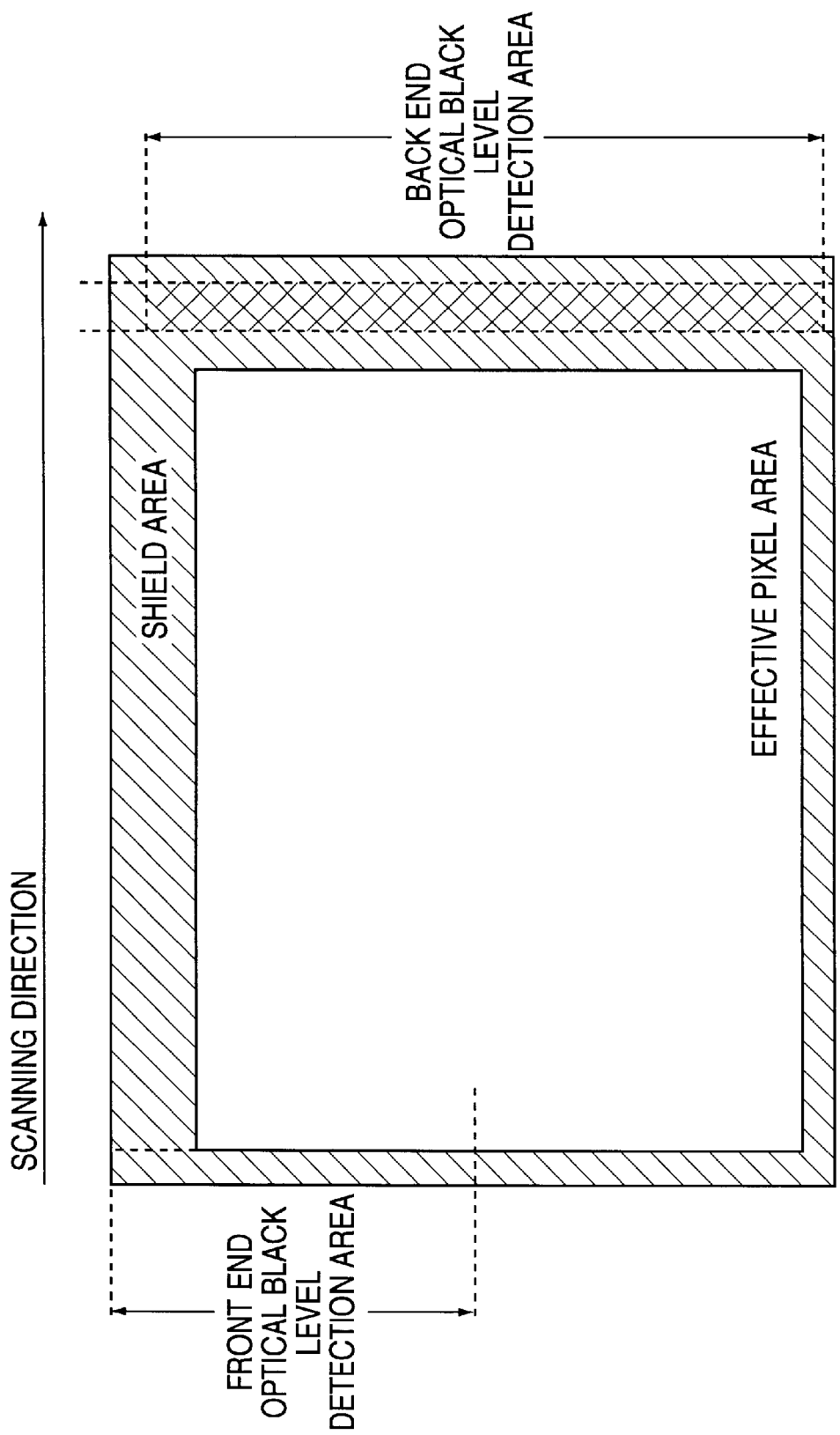
FIG. 10 is an illustrative view showing a front end OB level detection area and a back end OB level detection area used for calculation of a clamp level in FIG. 9 embodiment.

Briefly, the clamp level calculation circuit 50 calculates an average of pixel data, which is called a reference level, at every one line in the front end OB level detection area or the back end OB level detection area included in a light-shielded area shown in FIG. 10, and calculates a clamp level on the basis of the average. The clamp level calculation circuit 50 is constituted as shown in FIG. 11.

Figure 11:
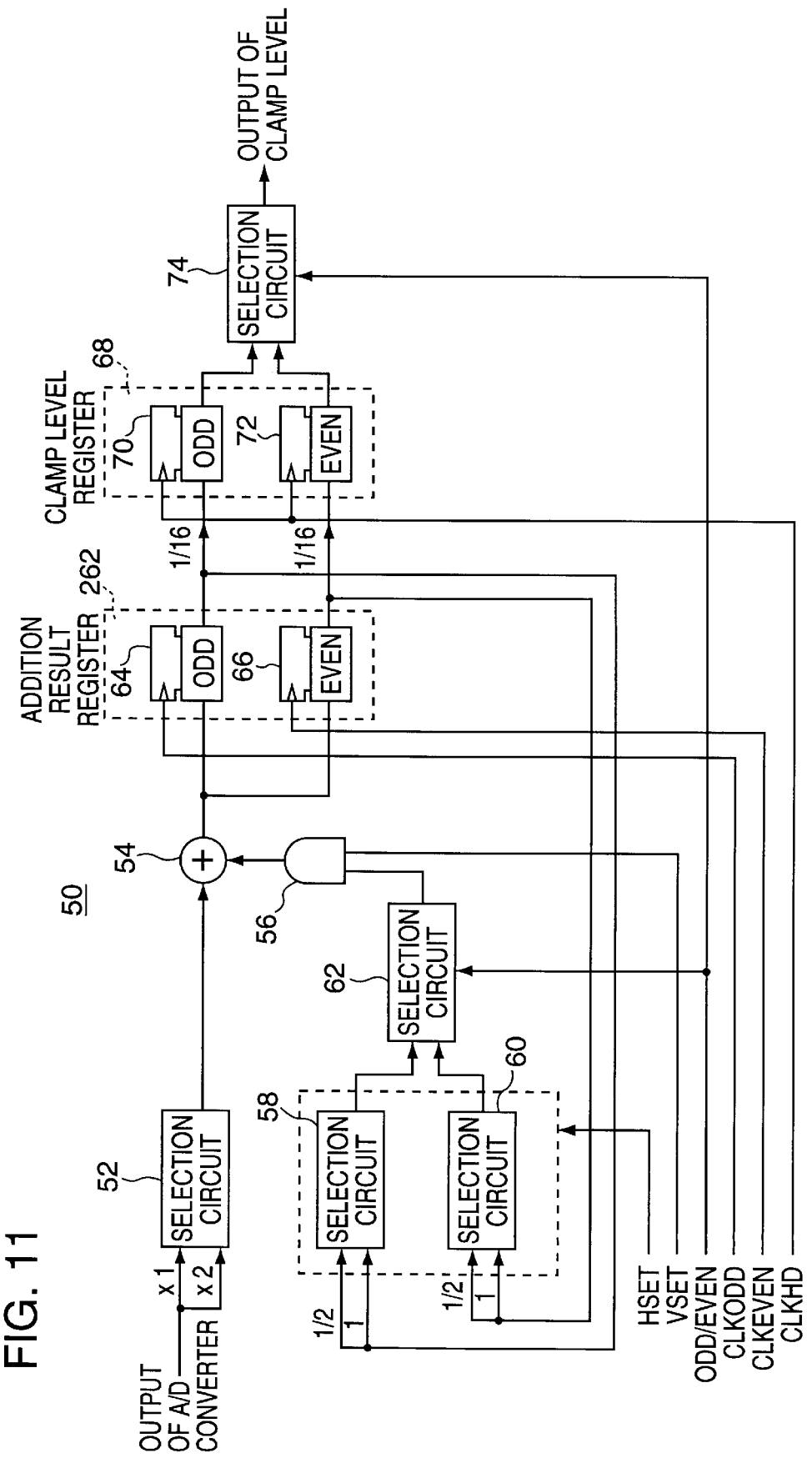
FIG. 11 is a block diagram showing one example of a clamp level calculation circuit of FIG. 9 embodiment.
Figure 12:
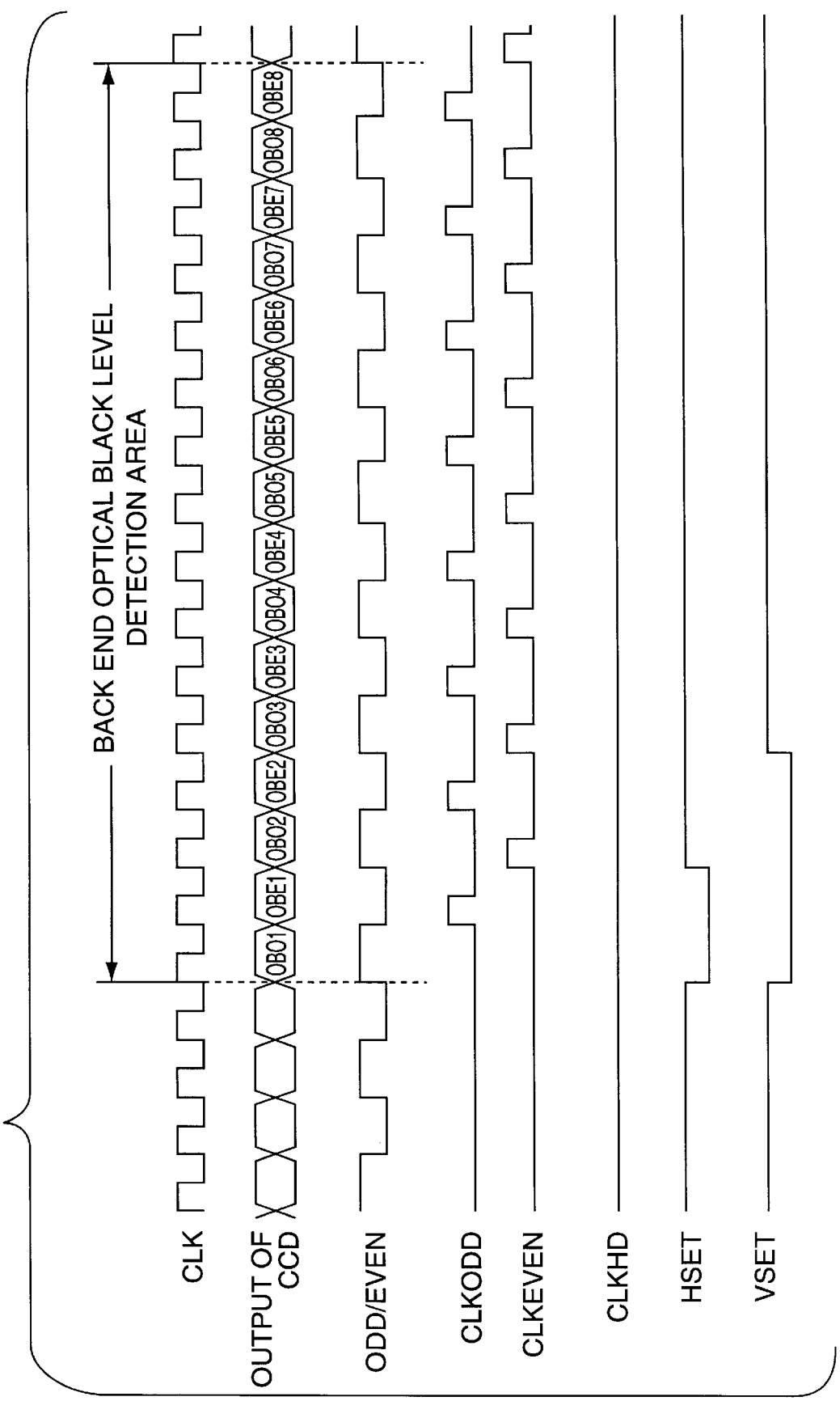
FIG. 12 is a timing chart showing an operation of FIG. 11 embodiment in a first predetermined period.
Figure 13:
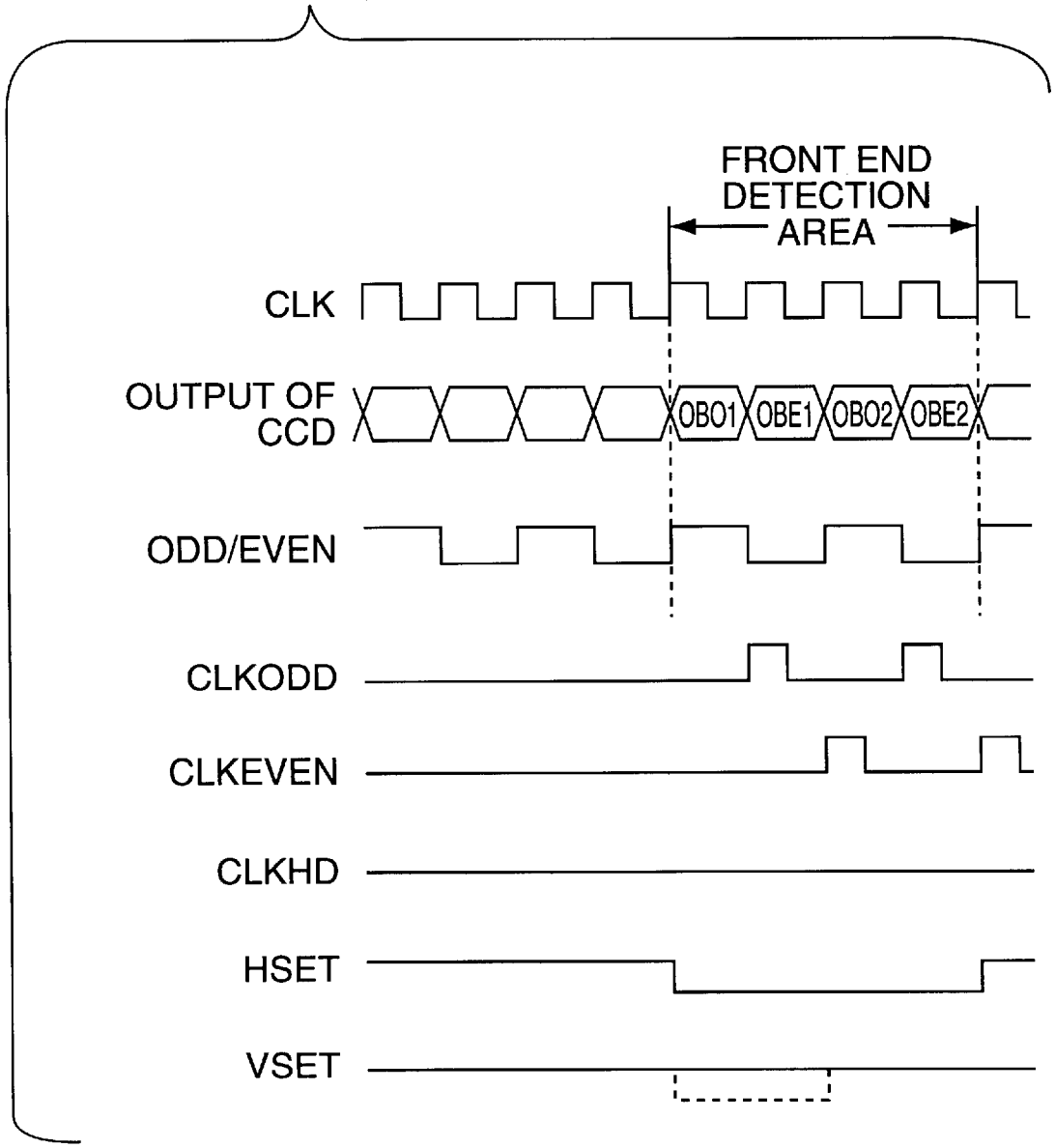
FIG. 13 is a timing chart showing an operation of FIG. 11 embodiment in a second predetermined period.

Referring to FIG. 11, the clamp level calculation circuit 50 includes a selection circuit 52 which receives the digital signal (input data) of eight bits, for example, from the A/D converter 46. The selection circuit 52 selectively outputs the input data and doubled data of the input data to the addition circuit 54. A selection circuit 62 selects an output of a selection circuit 58 or an output of a selection circuit 60 to apply as input to the addition circuit 54 through an AND gate 56. The AND gate 56 is controlled by a signal VSET shown in FIG. 12 or FIG. 13. The signal VSET becomes a low level at only a first odd number pixel and a first even number pixel in a first line included in the front end OB level detection area or the back end OB level detection area. Furthermore, the selection circuits 58 and 60 are controlled by a signal HSET shown in FIG. 12 or FIG. 13, and selectively outputs the input data or the doubled data of the input data. The signal HSET is a signal which becomes a low level at a first two odd number pixels and a first two even number pixels in each line included in the front end OB level detection area or the back end OB level detection area as shown in FIG. 12 or FIG. 13. The selection circuit 62 is controlled by a signal ODD/EVEN, and outputs the output of the selection circuit 58 at a time that the signal ODD/EVEN is a high level, and outputs the output of the selection circuit 60 at a time that the signal ODD/EVEN is a low level. The signal ODD/EVEN is a signal which is at the high level at odd number pixels and is at the low level at even number pixels as shown in FIG. 12 or FIG. 13.

Then, an output of the addition circuit 54 is applied to an addition result register 262. The addition result register 262 includes an odd number register 64 and an even number register 66. Out-of the output of the addition circuit 54, odd number pixel data is applied to the odd number register 64 and even number pixel data is applied to the even number register 66. Outputs of the odd number register 64 and the even number register 66 are applied to the above described selection circuits 58 and 60, respectively, and applied to an odd number register 70 and an even number register 72 included in a clamp level register 68, respectively. The addition result register 262 latches the output from the addition circuit 54, and the clamp level register 68 latches the output from the addition result register 262. In addition, each of the outputs from the odd number register 64 and the even number register is multiplied by $\frac{1}{16}$, and then, individually applied to the odd number register 70 and the even number register 72 to be latched.

The odd number register 64 receives a signal CLKODD as a latch signal, and the even number register 66 receives a signal CLKEVEN as a latch signal. The signal CLKODD is a clock outputted for each of the odd number pixels and the signal CLKEVEN is a clock outputted for each of the even numbers pixels as shown in FIG. 12 or FIG. 13. Furthermore, a signal CLKHD is commonly applied to the odd number register 70 and the even number register 72 as latch timing signals therefor. The signal CLKHD is a signal which becomes a high level at only one pixel at a right end shown in FIG. 10 for each line.

Then, an output of the odd number register 70 and an output of the even number register 72 are applied to the selection circuit 74. The selection circuit 74 is controlled by the signal ODD/EVEN in the same manner as that of the above selection circuit 62, and outputs the output of the odd number register 70 at a time that the signal ODD/EVEN is the high level, and outputs the output of the even number register 72 at a time that the signal ODD/EVEN is the low level.

Figure 14:
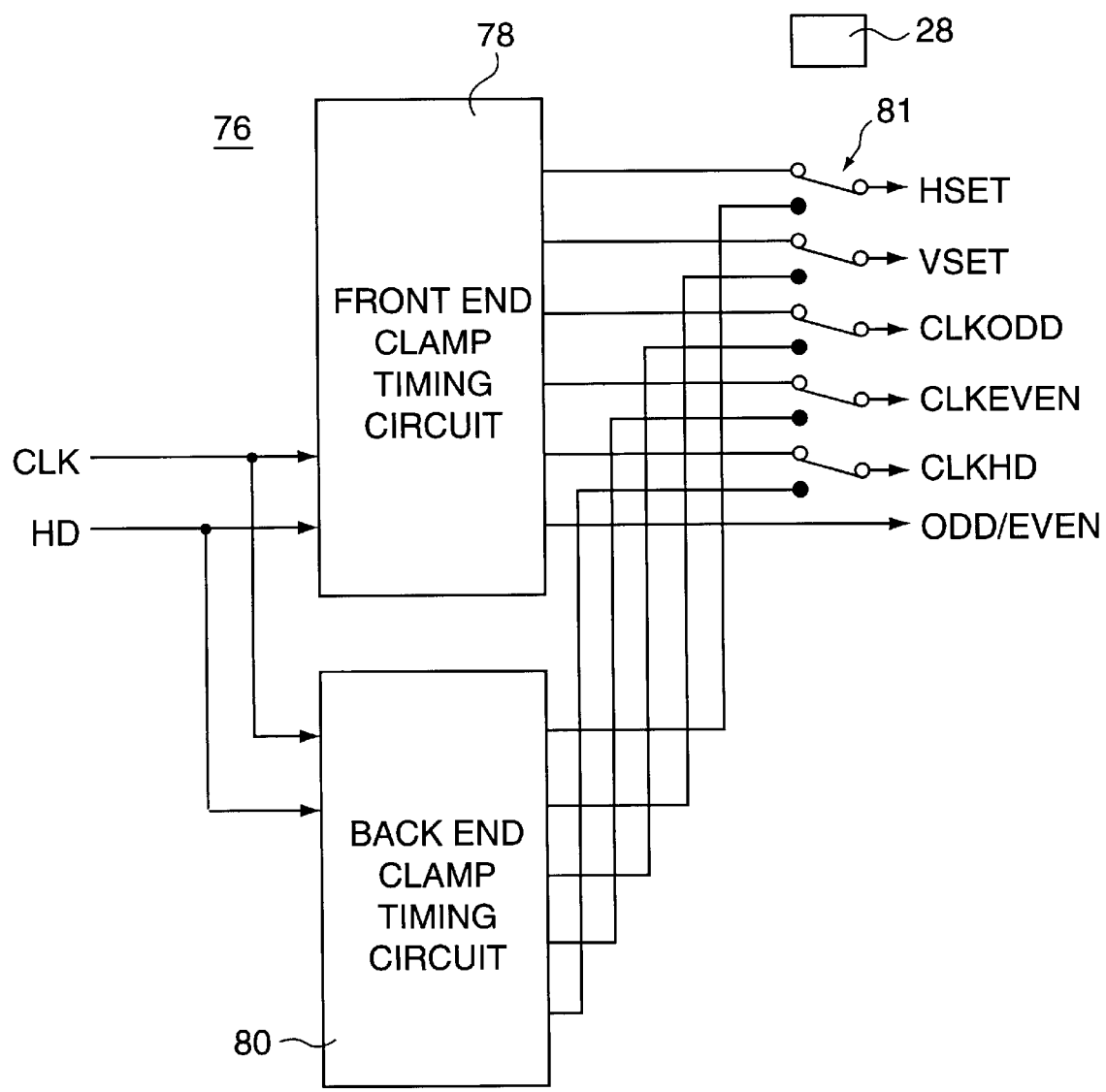
FIG. 14 is a block diagram showing a portion of a timing generator of FIG. 1 embodiment used for defining the first predetermined period and the second predetermined period.
Figure 15:
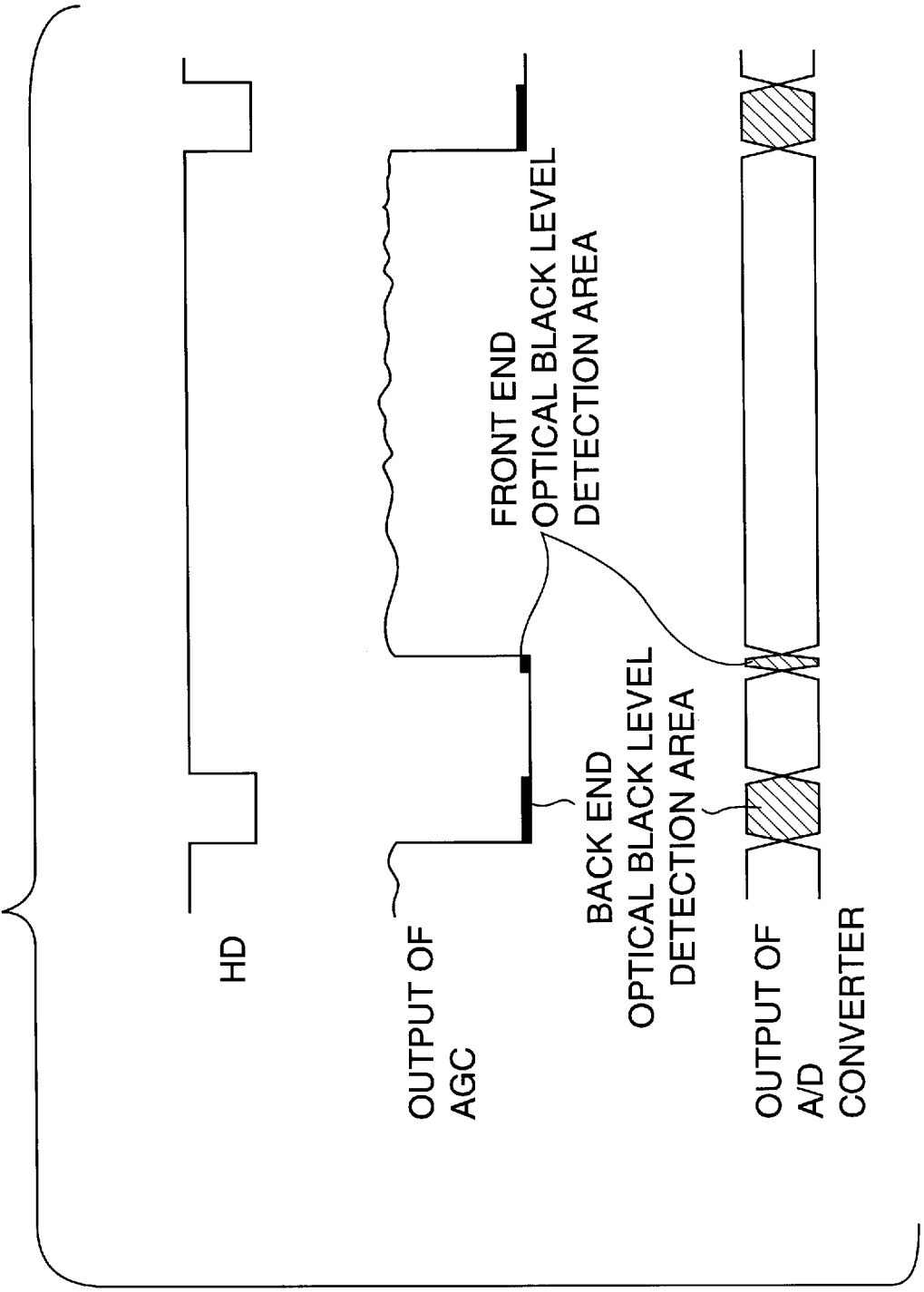
FIG. 15 is a timing chart showing the front end OB level detection area and the back end OB level detection area.

The timing signals shown in FIG. 12 or FIG. 13 are generated by a timing generator 76 shown in FIG. 1. More specifically, the timing generator 76 includes a front end clamp timing circuit 78 and a back end clamp timing circuit 80 as shown in FIG. 14. The front end clamp timing circuit 78 and the back end clamp timing circuit 80 both receives a master clock CLK and a horizontal synchronization signal HD, thereby to respectively define the front end OB level detection area (second predetermined period) and the back end OB level direction area (first predetermined period) shown in FIG. 10 and FIG. 15.

More specifically, the front end clamp timing circuit 78 is constituted by gate circuits, ROM decoder and etc., and outputs the timing signal shown in FIG. 13 only at the second predetermined period, that is, a period equal to two odd number pixels and two even number pixels at every one line within the front end OB level detection area on the basis of the master clock CLK and the horizontal synchronization signal HD.

The back end clamp timing circuit 80 is also constituted by gate circuits, ROM decoder and etc., outputs the timing signals shown in FIG. 12 only at the first predetermined period, that is, a period equal to eight odd number pixels and eight even number pixels at every one line within the back end OB level detection area.

Output signals of the front end clamp timing circuit 78 and the back end clamp timing circuit 80 are selectively outputted from the timing generator 76 by a switch 78 which interlocks with the quadruplication switch 28. Accordingly, the clamp level calculation circuit 50 is operated in response to the timing signals outputted from the front end clamp timing circuit 78 or the back end clamp timing circuit 80.

Now, an operation of the clamp level calculation circuit 50 in calculating the reference level in the first predetermined period with using the eight odd number pixels will be described. The selection circuit 52 selects "x2" at a timing of the first line. Accordingly, the input data is shifted-up by one bit, and therefore, the doubled data is consequently outputted from the selection circuit 52. At that time, since the signal VSET which is the control signal of the AND gate 56 becomes the low level as shown in FIG. 12, the output of the addition circuit 54 becomes the doubled data of a first odd number pixel. The doubled data is applied to the odd number register 64 and the even number register 66, and the doubled data applied to the odd number register 64 is latched in response to the signal CLKODD shown in FIG. 12. Then, latched data latched by the odd number register 64 is applied to the selection circuit 58. The selection circuit 58 outputs the doubled data from the odd number register 64 as it is in response to the signal HSET which is the low level as shown in FIG. 12. Since the selection circuit 62 selects the output of the selection circuit 58 at a time that the signal ODD/EVEN is the high level and selects the output of the selection circuit 60 at a time that the signal ODD/EVEN is the low level, the selection circuit 62 selects the doubled data to apply to the AND gate 56. That is, data inputted to the AND gate 56 is the doubled data of the first odd number pixel data.

When a second odd number pixel data is inputted, doubled data of the second odd number pixel data is also outputted to the addition circuit 54 from the selection circuit 52. Since the signal VSET is the high level at the time, the doubled data of the first odd number pixel data is applied to the addition circuit 54 through the AND gate 56. Accordingly, the addition circuit 54 adds the doubled data of the first odd number pixel data to the doubled data of the second odd number pixel data, and the addition result is latched by the odd number register 64. Thereafter, the same operation is repeated until an eight odd number pixel data is inputted, and sixteen times data of the first odd number pixel data is consequently latched by the odd number 64.

Latched data latched by the odd number register 64 is multiplied by $\frac{1}{16}$ or divided by 16, that is, shifted-down by four bits, and in response to the latch signal CLKHD which becomes the high level at the right end of the screen for each line, shifted-down data is latched by the odd number register 70. Accordingly, the selection circuit 74 outputs latched data latched by the odd number register 70 at a time that the signal ODD/EVEN is the high level. The latched data is the reference level of the eight odd number pixels in the first line within the back end OB level detection area (FIG. 10).

At and after a second line, the selection circuit 52 selects "x1", and the selection circuits 58 and 60 select "x½" only at a first pixel, and select "x1" at succeeding seven pixels. Accordingly, sixteen times data is again outputted from the addition register 62, and then, multiplied by ¹⁄₁₆. Therefore, the reference level is obtained from the selection circuit 74 for each line. That is, recursive digital filter is constituted by a circuitry from the addition circuit 54 and through the addition result register 262, the selection circuit 58, 60 and 62, and the AND gate 56.

In addition, though a weighting coefficient "k" of the recursive digital filter is set into "½" in this embodiment, an arbitrary value within a range of "0 <k<1" can be set as the weighting coefficient "k". More specifically, though the clamp level of the first line is the reference level calculated from pixel data included in the line, each of the clamp levels at and after second line is a weighted average level of a clamp level of a preceding line and a newly obtained reference level with the coefficient "k". Accordingly, even if a noise is included at and after the second line of the front end OB level detection area, it is possible to reduce an influence of the noise on the image into "1/k".

In addition, only the operation that the reference level is obtained from the odd number pixels and the clamp level is calculated on the basis of the reference level is described; however, an operation for the even number pixels is similar to the operation for the odd number pixels except that the signal ODD/EVEN becomes the low level so that the selection circuit 62 selects an output of the selection circuit 60 and the selection circuit 74 selects an output of the selection circuit 72, and therefore, a duplicate description will be omitted here. In any cases, the circuit shown in FIG. 11 calculates the clamp level for each of the odd number pixels or for each of the even number pixels.

Furthermore, since operations of the clamp level calculation circuit 50 in the second predetermined period is similar to the operations in the first predetermined period except that the reference level is calculated from two pixels data in the second predetermined period, a duplicate description will be omitted here.

Thus, the clamp level is outputted from the clamp level calculation circuit 50, and then inputted to a first subtraction circuit 82 shown in FIG. 9. Accordingly, the clamp level calculated by the clamp level calculation circuit 50 is subtracted from the data obtained by adding the offset by the addition circuit 48, by the first subtraction circuit 82, whereby the digital signal outputted from the A/D converter 46 can be digitally clamped.

An output of the first subtraction circuit 82 is zero-clipped by a zero-clipping circuit 84 including OR gates and etc., for example, that is, a negative value included in the output of the first subtraction circuit 82 is forcedly set to the zero, and then, an output of the zero-clipping circuit 84 is applied to a second subtraction circuit 88 through a digital low-pass filter 86. The second subtraction circuit 88 also receives, at its subtrahend input, an offset which is the same as the offset applied to the addition circuit 48 from the CPU 44.

Figure 16:
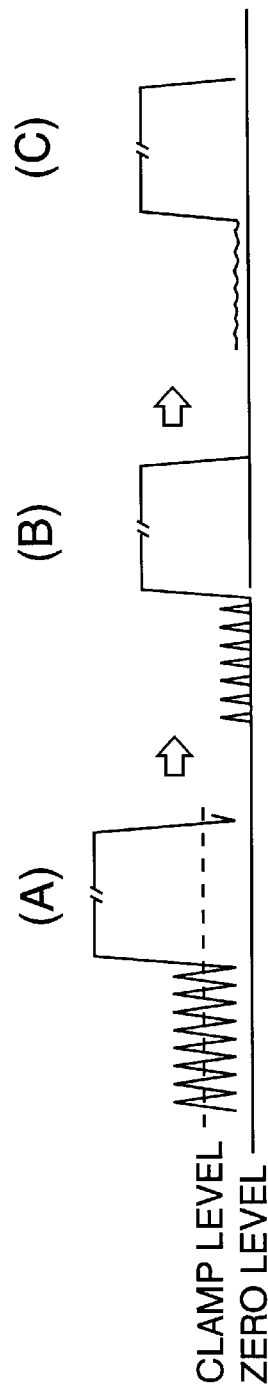
FIG. 16 is a waveform chart showing an operation in a case where no offset is added and subtracted in FIG. 9 embodiment.
Figure 17:
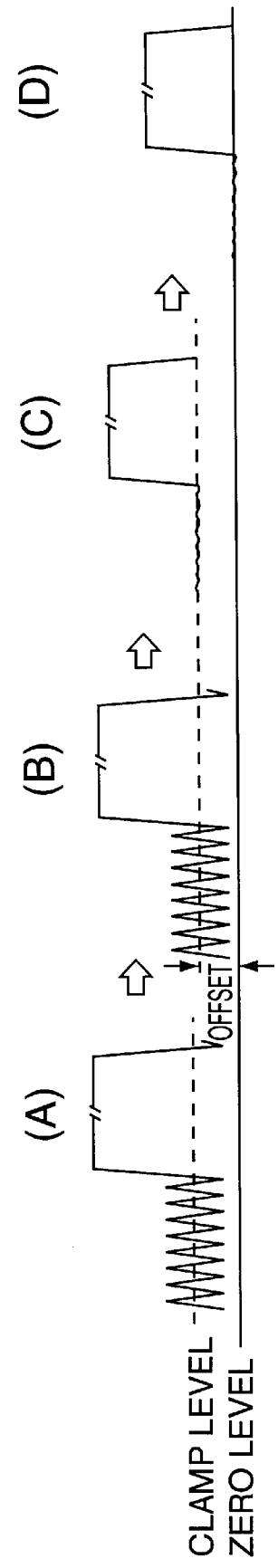
FIG. 17 is a waveform chart showing an operation of FIG. 9 embodiment.

A case where no offset is used and a case where the offset is added by the addition circuit 48 and then subtracted by the second subtraction circuit 88 will be described in detail with referring to FIG. 16 and FIG. 17. Each of FIG. 16(A) and FIG. 17(A) shows a camera signal of one line, i.e. a CCD signal outputted from the A/D converter 46 in a case where an object having a black portion at a left and a white portion at a right. Since an actual CCD signal includes a random noise, each of the camera signals has a waveform as shown in FIG. 16(A) and FIG. 17(A). The clamp level is a level shown by a dotted line, and the camera signal is clamped by the first subtraction circuit 82 at the level.

In a case where no offset is added, the output of the zero-clipping circuit 84 becomes a signal shown in FIG. 16(B). If the signal is inputted to the low-pass filter 86, the signal becomes to have a waveform shown in FIG. 16(C), and therefore, a portion should be displayed in black does not become zero level. Therefore, the black level deviation occurs.

However, if the offset is added by the addition circuit 48 in accordance with this embodiment, the output of the zero-clipping circuit 84 becomes to have a waveform shown in FIG. 17(B). Then, if the output is processed by the low-pass filter 80, the output of the low-pass filter 80 has a waveform shown in FIG. 17(C). Accordingly, by subtracting the offset from the output of the low-pass filter 80 by the second subtraction circuit 88, the signal of a portion to be displayed in black becomes substantially zero as shown in FIG. 18(D), therefore, it is possible to obtain the video signal having no black level deviation.

As described in the above, the offset can be changed in accordance with the gain of the AGC circuit 42. That is, since a noise becomes large when the gain is large, the black level deviation can be prevented by increasing the offset, and since the noise is small when the gain is small, a dynamic range of the camera signal can be increased by decreasing the offset.

Though the CCD imager 12 is constituted in a manner that the charges of the pixels adjacent to each other in the vertical direction are outputted in the above described first embodiment, it is possible to use a CCD imager having dual-channel structure in which all pixel data of 480 lines that is the same as the number of the pixels in the vertical direction are outputted at every one field without mixing the charges of the two pixels. Such a CCD imager uses a color filter of primary colors as shown in FIG. 20 and has horizontal transfer CCDs 20a and 20b shown in FIG. 21. Accordingly, an embodiment in which such the CCD imager 112 is used will be described as a second embodiment.

In the normal mode or first mode, the CCD imager 112 is operated in accordance with the field-by-field storage mode as shown in FIG. 22. More specifically, the charges stored in the photo-diodes 14 are read-out to the vertical transfer CCDs 16 at every one field. Thereafter, the vertical transfer pulse having two succeeding rising edges in one line is supplied to the vertical transfer CCDs 16, and the charges of two lines are simultaneously transferred to the horizontal transfer CCDs 20a and 20b at every one line, respectively. Each of the horizontal transfer CCDs 20a and 20b outputs the charges of one line for one line period in response to the horizontal transfer clock. More specifically, the charges of the odd lines such as 1, 3, 5, . . . are outputted from the horizontal transfer CCD 20a as an output of a first channel, and the charges of the even lines such as 2, 4, 6, . . . are outputted from the horizontal transfer CCD 20d as an output of a second channel.

Figure 23:
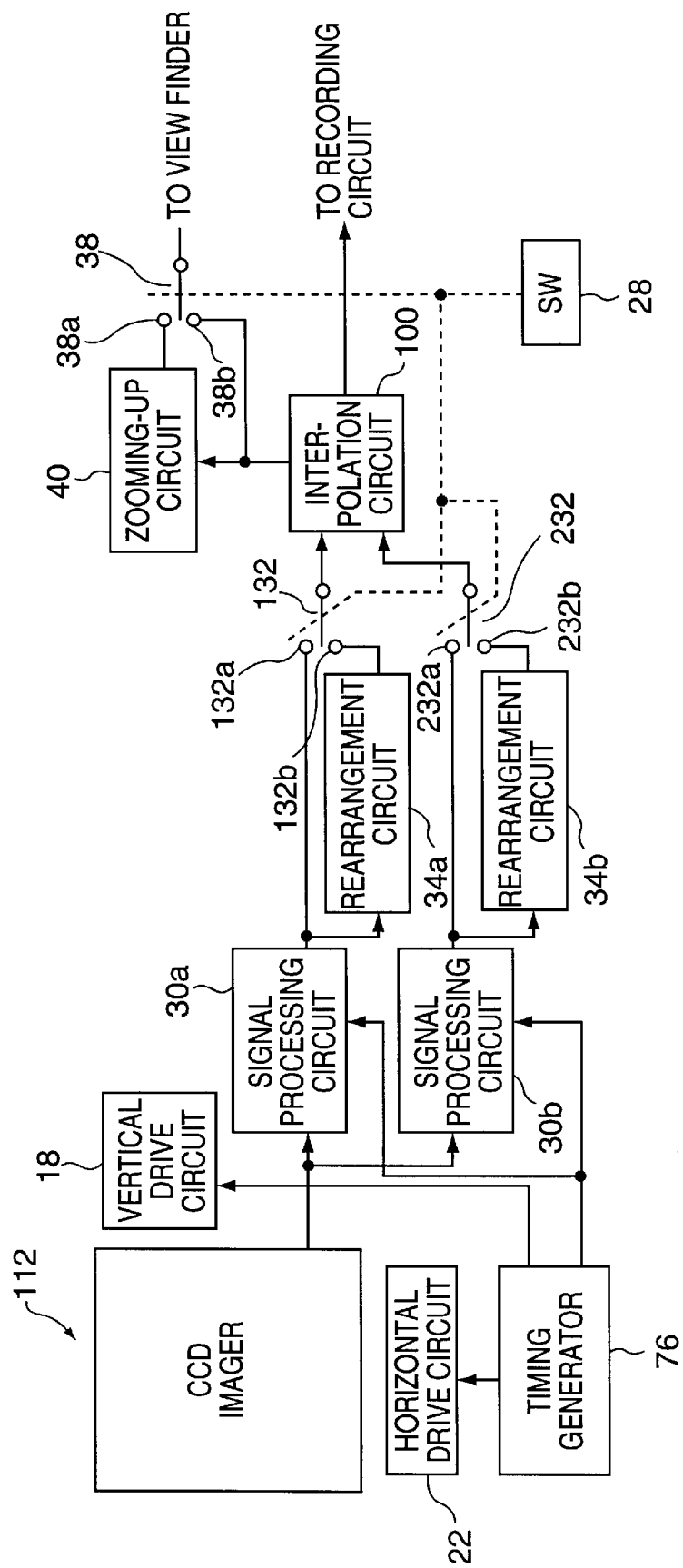
FIG. 23 is a block diagram showing the second embodiment.

The outputs of the first channel and the second channel thus obtained are inputted to signal processing circuits 30a and 30b as shown in FIG. 23, respectively. Each of the signal processing circuits 30a and 30b has the same structure as that of the signal processing circuit 30 shown in FIG. 9, and therefore, the outputs of the first channel and the second channel are individually clamped by the same operation.

Figure 24:
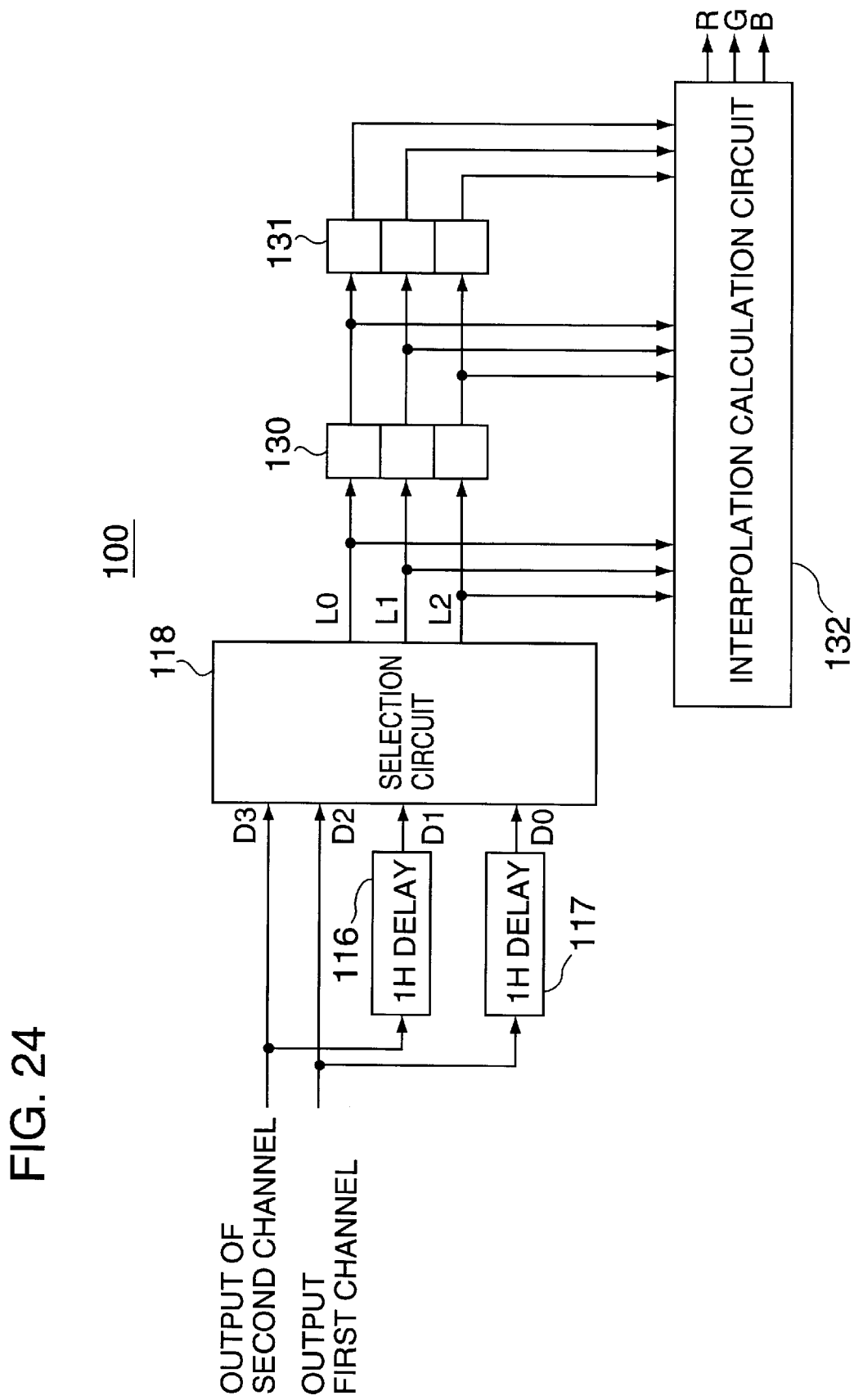
FIG. 24 is a block diagram showing an interpolation circuit of FIG. 23 embodiment.

The color camera signals outputted from the signal processing circuits 30a and 30b are inputted to an interpolation circuit 100 via switches 132 and 232. The interpolation circuit 100 is constituted as shown in FIG. 24. More specifically, the camera signal of the first channel through the switch 132 is directly applied to a selection circuit 118 as a digital signal D3, and to the selection circuit 118 as a digital signal D1 via a 1H delay 116. The color camera signal of the second channel through the switch 232 is directly supplied to the selection circuit 118 as a digital signal D2, and to the selection circuit 118 via a 1H delay 117 as a digital signal D0. The 1H delays 116 and 117 are memories capable of storing the signals of the first channel and the second channel for a 1H (one line) period, and the signals of the first channel and the second channel which are delayed for the 1H period can be obtained through the 1H delays 116 and 117. In addition, writing or reading-out operations of the 1H delays 116 and 117 are performed in synchronization with the operations of the horizontal transfer CCDs 20a and 20b.

The selection circuit 118 selects some digital signals equal to three lines out of the digital signals D0 to D3 of adjacent four lines in accordance with whether a current field is an odd field or an even field. The digital signals D1 to D3 are outputted as outputs L0 to L2 at the odd field, and the digital signals D0 to D2 are outputted as outputs L0 to L2 at the even field.

The outputs L0 to L2 of the selection circuit 118 are directly inputted to an interpolation calculation circuit 132 and a delay 130, and outputs of the delay 130 are inputted to a delay 131. Each of the delays 130 and 131 has a delay period equal to a time period that one pixel signal is transferred, and outputs of the delays 130 and 131 are respectively inputted to the interpolation calculation circuit 132. Accordingly, successive three pixels in each of the adjacent three lines, that is, signals equal to nine pixels in total are simultaneously inputted to the interpolation calculation circuit 132.

Figure 25:
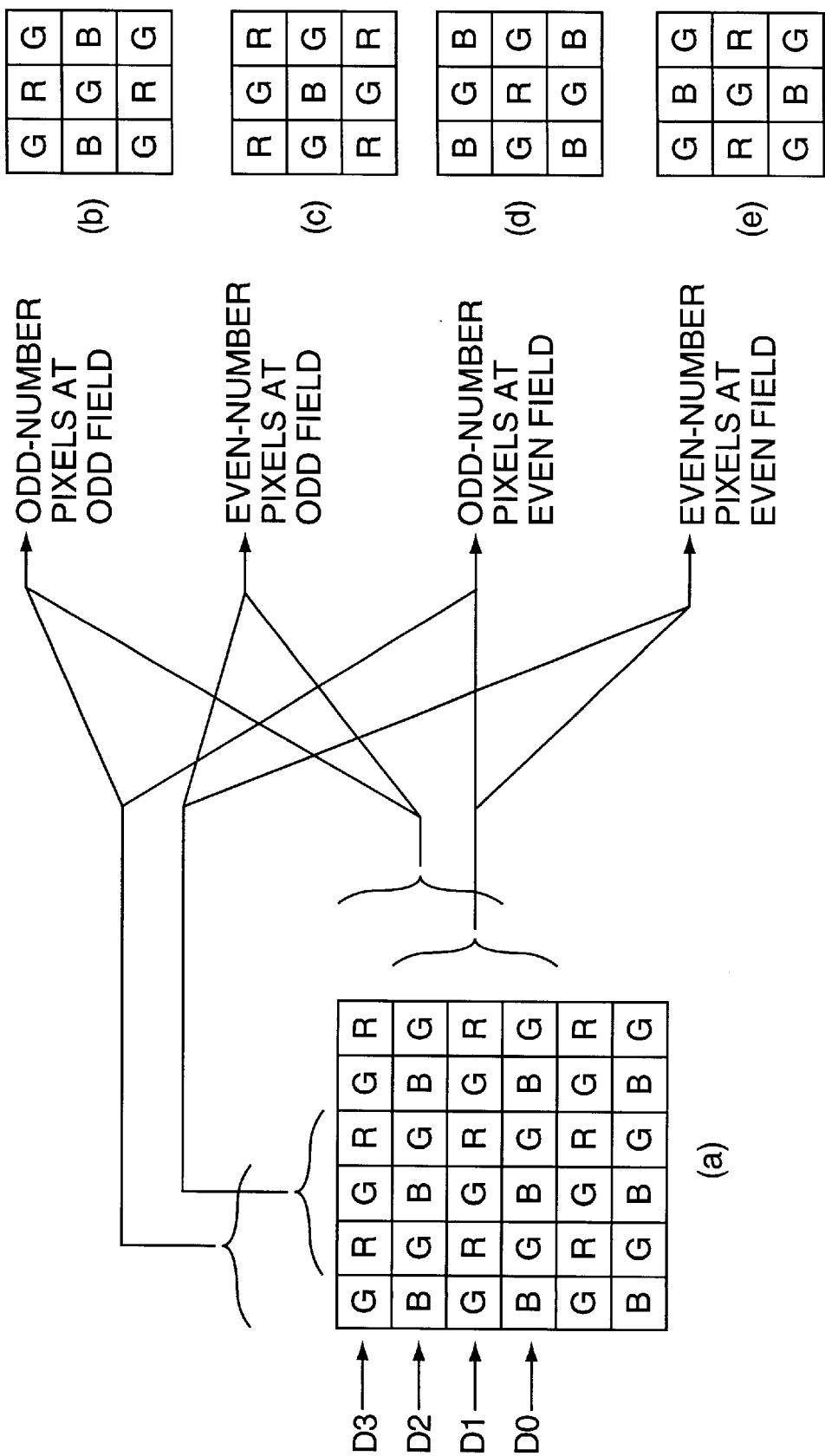
FIG. 25 is an illustrative view showing an operation of the interpolation circuit of FIG. 23 embodiment.

Since filter elements each of which has a primary color are arranged in a mosaic fashion to form the mosaic-type color filter shown in FIG. 20, only one color signal out of an R signal, a G signal and a B signal is obtained from each pixel, and therefore, each of remaining color signals of each pixel is obtained by performing interpolation calculation with using adjacent pixels by the interpolation calculation circuit 132. A relationship between an arrangement of the pixels on the mosaic-type color filter and selected pixels is shown in FIG. 25. As described above, the digital signals D1 to D3 are selected at the odd field, and therefore, a pixel pattern of the odd number pixels becomes as shown in FIG. 25(b), and a pixel pattern of the even number pixels is shown in FIG. 25(c). In contrast, since the digital signals D0 to D2 are selected at the even field, a pixel pattern of the odd number pixels is shown in FIG. 25(d), and a pixel pattern of the even number pixels is shown in FIG. 25(e). In addition, FIG. 25(a) shows a portion of the arrangement of the pixels on the mosaic-type color filter.

As understood from FIG. 25, if it is determined whether a current field is in the odd field or the even field and the current pixel is an odd number pixel or an even number pixel, any one of the pixel patterns shown in FIG. 25(b) to FIG. 25(e) can be determined. Since the G signal is obtained from a center pixel in a case of FIG. 25(b), for example, the G signal is outputted from the center pixel as it is. Since two R signals are obtained from two pixels at the top and the bottom of a middle vertical line, an average of the two R signals is outputted as the R signal of the center pixels. Since two B signals are obtained from two pixels of the left side and the right side of a middle horizontal line, an average of the two B signals is outputted as the B signal of the center pixel. Furthermore, in a case of FIG. 25(c), each of the R signal and the G signal of the center pixel is obtained by averaging the same signals of four pixels adjacent to the center pixel.

Thus, by interpolating lacking two color signals of a pixel to be processed on the basis of the same color signals of adjacent pixels, the R signal, the G signal and the B signal of each pixel can be obtained. The R signal, the G signal and the B signal are applied to the recording circuit (not shown) and the view finder (not shown).

Figure 26:
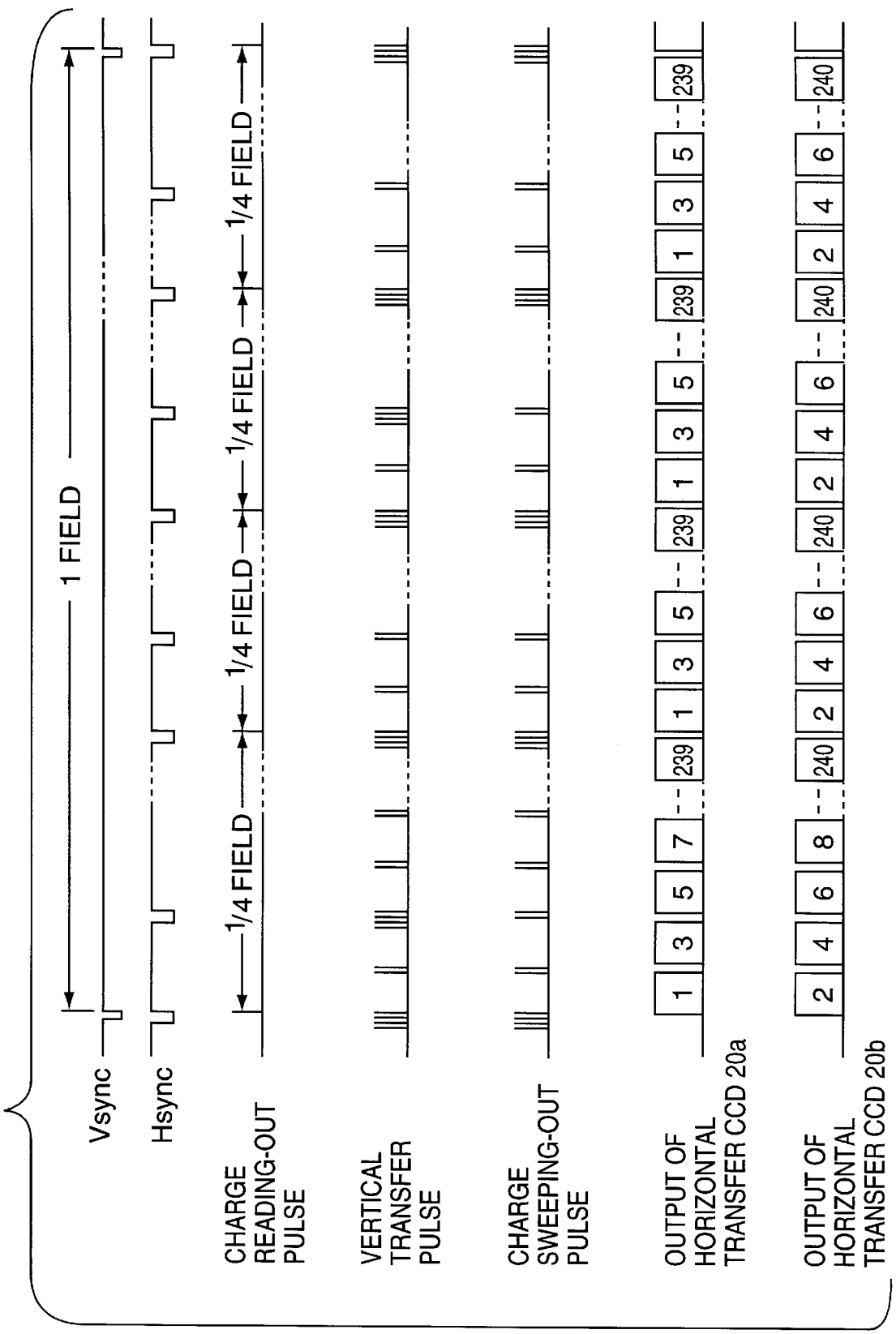
FIG. 26 is a timing chart showing an operation of the second embodiment in a quadruplication mode (a second mode).

In the quadruplication mode, the drive of the CCD imager 112 is performed as shown in FIG. 26. More specifically, the charge reading pulse is supplied to the vertical transfer CCDs 16 at every quarter field as shown in FIG. 26, and each of the vertical transfer CCDs 16 is driven by the vertical transfer pulse which has two succeeding rising edges at a half line and is generated 240 times during a sweeping-out period at every quarter field. Accordingly, the charges equal to two lines are transferred to the horizontal transfer CCDs 20a and 20b at every half line. That is, since each of the horizontal transfer CCDs 20a and 20b is driven by the horizontal transfer clock which is the same as the horizontal transfer clock used in the normal mode, the charges of a succeeding line are started to be transferred from the vertical transfer CCDs 16 at a timing that the horizontal transfer CCDs 20a and 20b have finished transferring the first half charges but the second half charges are still remaining.

On the other hand, a sweeping-out pulse is provided at that timing, and the sweeping-out control gates 26 are opened by the sweeping-out pulse. Accordingly, the second half charges are swept-out from the drain 24 through the sweeping-out control gates 26. That is, in the quadruplication mode, only the first half charges of each line are outputted from the horizontal transfer CCDs 20a and 20b, and the second half charges of each line are swept-out from the drain 24. In other words, the first half charges of the odd lines from "1" to "239" are outputted from the horizontal transfer CCD 20a, and the first half charges of the even lines from "2" to "240" are outputted from the horizontal transfer CCD 20b.

Furthermore, as shown in FIG. 23, rearrangement circuits 34a and 34b each of which has the same structure as that of the rearrangement circuit 34 are individually provided. Outputs of the rearrangement circuits 34a and 34b are applied to the interpolation circuit 100 through switches 132 and 232, respectively. Then, output of the interpolation circuit 100 is applied to the recording circuit and the zooming-up circuit 40. Accordingly, an image which is zoomed-up is outputted to the view finder.

In addition, the first embodiment was described with using the mosaic-type color filter of complimentary colors, and the second embodiment was described with using the mosaic-type color filter of primary colors; however, the present invention can be applied to a case where a camera signal from a CCD imager having a stripe-type color filter is processed.

Figure 19:
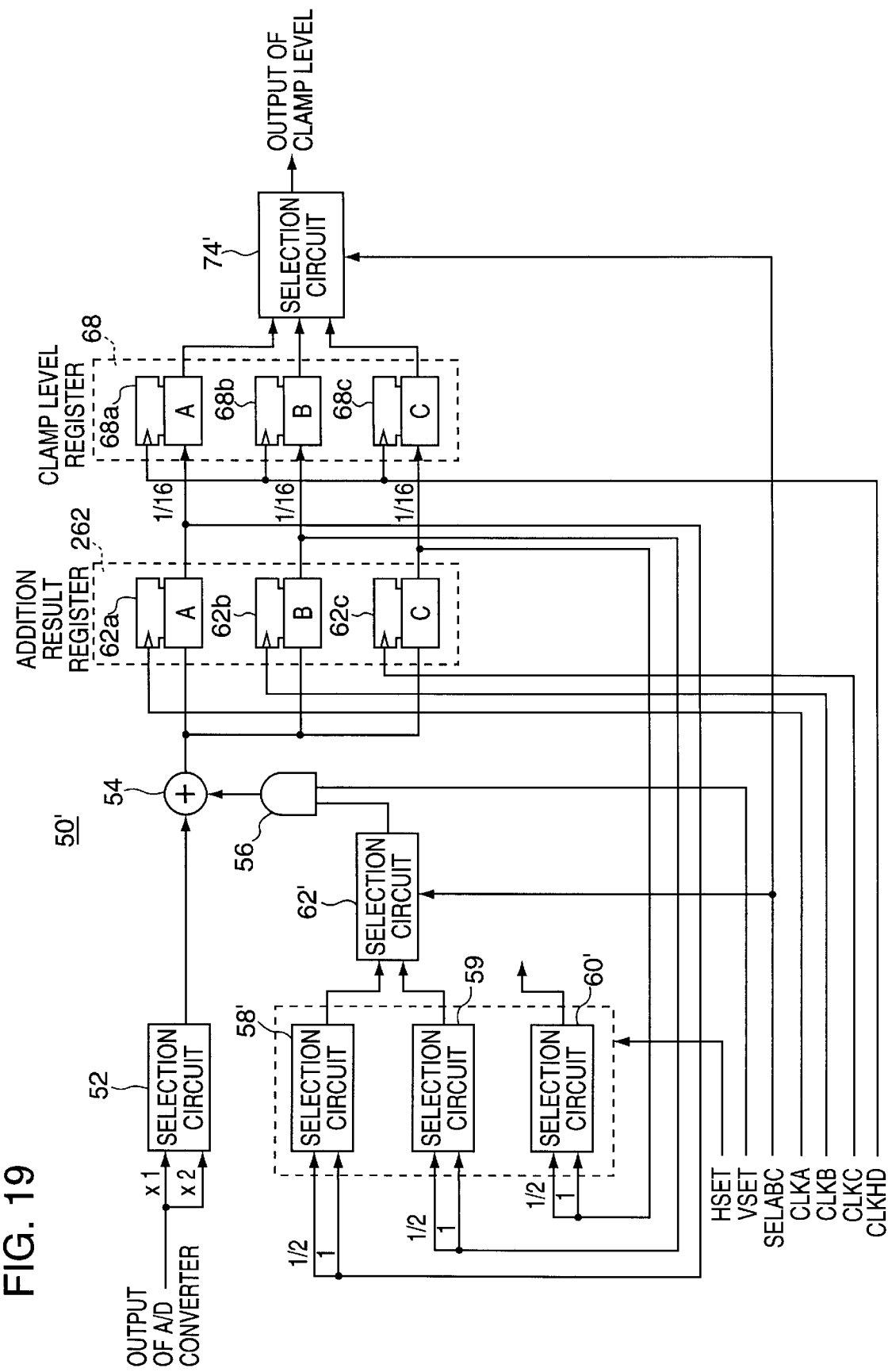
FIG. 19 is a block diagram particularly showing the clamp level calculation circuit in a case where a CCD imager having a stripe-type color filter is used in FIG. 9 embodiment.

In such a case, a clamp level calculation circuit 50' shown in FIG. 19 includes a selection circuit 52, an addition circuit 54, an AND gate 56, an addition result register 262, selection circuits 58', 59, 60' and 62', a clamp level register 68 and a selection circuit 74' as similar to the clamp level calculation circuit 50 of FIG. 11. The selection circuits 62' and 74' are controlled by a signal (a color separation pulse) SELABC which becomes a high level at every one pixel of the stripe-type color filter (not shown). The selection circuit 62' selects an output of the selection circuit 58' and the selection circuit 74' selects an output of a register 68a at a time that the signal SELABC is the high level at a timing of a first pixel, the selection circuit 52' selects an output of the selection circuit 59 and the selection circuit 74' selects an output of a register 68b at a time that the signal SELABC is the high level at a timing of a second pixel, and the selection circuit 62' selects an output of the selection circuit 60' and the selection circuit 74' selects an output of the register 68c at a time that the signal SELABC is the high level at a timing of a third pixel. Since the other operations are easily understood from the operations of the clamp level calculation circuit 50 shown in FIG. 11, a duplicate description will be omitted. In any cases, the clamp level calculation circuit 50' calculates a clamp level of each pixel at every three pixels.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital video camera, comprising:
   a CCD imager including a plurality of vertical transfer CCDs which read-out charges stored in a plurality of photo-electric conversion elements and successively transfer read-out charges in a vertical direction, and a plurality of horizontal transfer CCDs which successively transfer charges transferred from said plurality of vertical transfer CCDs, in a horizontal direction;
   a switching means for switching a first mode that a whole of each line signal outputted from said CCD imager is utilized for displaying an image and a second mode that only a portion of each line signal including a front end of each line signal outputted from said CCD imager is utilized for displaying an image;
   a first period defining means for defining a first predetermined period at a back end of said line signal in said first mode;
   a second period defining means for defining a second predetermined period at said front end of said line signal in said second mode;
   an A/D conversion means for converting said line signal obtained from said CCD imager into a digital signal;
   a clamp level calculation means for calculating a clamp level on the basis of said digital signal in one of said first predetermined period and said second predetermined period; and
   a clamping means for clamping said line signal at said clamp level.

2. A digital video camera according to claim 1, wherein said CCD imager includes a plurality of vertical transfer CCDs which read-out M, where M is an integer greater than 1, ones of the plurality of photo-electric conversion elements at N, where N is an integer larger than 1, times per one field period and transfers read-out charges in a vertical direction, L, where L is an integer equal to or larger than 1, horizontal transfer CCDs which transfer charges equal to one line transferred from said plurality of vertical transfer CCDs in a horizontal direction for one horizontal line period, and a drain which is provided in parallel to said horizontal transfer CCDs and sweeps-out unnecessary charges, further comprising:
   a drive circuit for driving said CCD imager, in said second mode, in a manner that vertical transfer pulses of N times a number of lines of said CCD imager are applied to each of said plurality of vertical transfer CCDs within said one field period so as to transfer (1/N) ×M charges out of M charges at a low speed by said horizontal transfer CCDs, and sweep-out (1−1/N)×M charges to said drain at a high speed.

3. A digital video camera according to claim 1, further comprising:
   an addition means for adding a predetermined offset to one of said digital signal and a clamped digital signal so as to define an offset digital signal;
   a first subtraction means for subtracting a clamp level from the digital signal so as to define the clamped digital signal;
   a clipping means for zero-clipping the clamped digital signal so as to define a clipped signal;
   a low-pass filter means for processing the clipped signal from said clipping means so as to define a filtered signal; and
   a second subtraction means for subtracting said predetermined offset from the filtered signal.

4. A digital video camera according to claim 1 wherein said clamp level calculation means includes an averaging means for calculating and average of optical black (OB) levels included in said line signal, and a recursive digital filter means for calculating said clamp level on the basis of said average level obtained by said averaging means for each line.

5. A digital video camera according to claim 2 wherein said clamp level calculation means includes an averaging means for calculating an average of optical black (OB) levels included in said line signal, and a recursive digital filter means for calculating said clamp level on the basis of said average level obtained by said averaging means for each line.

6. A digital video camera according to claim 3 wherein said clamp level calculation means includes an averaging means for calculating an average of optical black (OB) levels included in said line signal, and a recursive digital filter means for calculating said clamp level on the basis of said average level obtained by said averaging means for each line.

7. A digital video camera according to claim 1, wherein said CCD imager includes a plurality of vertical transfer CCDs which read-out M, where M is an integer greater than 1, charges stored in M ones of said plurality of photo-electric conversion elements at N, where N is an integer greater than 1, times per one field period and transfers read-out charges in a vertical direction, L, where L is an integer of at least 1, horizontal transfer CCDs which transfer charges equal to one line transferred from said plurality of vertical transfer CCDs in a horizontal direction for one horizontal line period, and a drain which is provided in parallel to said horizontal transfer CCDs and sweeps-out unnecessary charges, further comprising:
   a drive circuit for driving said CCD imager, in said second mode, in a manner that vertical transfer pulses of N times a number of lines of said CCD imager are applied to each of said plurality of vertical transfer CCDs within said one field period so as to transfer M/N charges out of said M charges at a low speed by said horizontal transfer CCDs and sweep-out M(1−1/N) charges to said drain at a high speed, and
   wherein the camera further comprises:
      an addition means for adding a predetermined offset to one of said digital signal and a clamped digital signal to generate an offset digital signal;
      a first subtraction means for subtracting a clamp level from the offset digital signal so as to define the clamped digital signal;
      a clipping means for zero-clipping the clamped digital signal so as to define a clipped signal;
      a low pass filter means for processing the clipped signal so as to define a filtered signal; and
      a second subtraction means for subtracting said predetermined offset from the filtered signal.

* * * * *